(12) United States Patent
Parthasarathy et al.

(10) Patent No.: US 8,958,187 B2
(45) Date of Patent: Feb. 17, 2015

(54) ACTIVE DETECTION AND PROTECTION OF SENSITIVE CIRCUITS AGAINST TRANSIENT ELECTRICAL STRESS EVENTS

(71) Applicant: Analog Devices, Inc., Norwood, MA (US)

(72) Inventors: Srivatsan Parthasarathy, Acton, MA (US); Javier Alejandro Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 273 days.

(21) Appl. No.: 13/673,896

(22) Filed: Nov. 9, 2012

(65) Prior Publication Data

US 2014/0133055 A1 May 15, 2014

(51) Int. Cl.
*H02H 9/00* (2006.01)
*H02H 9/04* (2006.01)

(52) U.S. Cl.
CPC .................................... *H02H 9/041* (2013.01)
USPC .......................................................... 361/56

(58) Field of Classification Search
CPC .................................. H02H 9/04; H02H 9/046
See application file for complete search history.

(56) References Cited

U.S. PATENT DOCUMENTS

| | | | |
|---|---|---|---|
| 5,719,733 A | 2/1998 | Wei et al. | |
| 5,748,425 A | 5/1998 | Gutsch et al. | |
| 5,835,328 A | 11/1998 | Maloney et al. | |
| 6,429,489 B1 | 8/2002 | Botula et al. | |
| 6,442,008 B1 | 8/2002 | Anderson | |
| 6,614,633 B1 | 9/2003 | Kohno | |
| 7,064,393 B2 | 6/2006 | Mergens et al. | |
| 7,102,862 B1 | 9/2006 | Lien et al. | |
| 7,706,113 B1 | 4/2010 | Lien et al. | |
| 7,738,222 B2 | 6/2010 | Deutschmann et al. | |

(Continued)

FOREIGN PATENT DOCUMENTS

| | | |
|---|---|---|
| EP | 1617477 A1 | 1/2006 |
| EP | 1048078 B1 | 5/2010 |
| WO | WO 2009/050641 | 4/2009 |

OTHER PUBLICATIONS

Salcedo et al., Electrostatic Discharge Protection Framework for Mixed-Signal High Voltage CMOS Applications. 9th International Conference on Solid-State and Integrated-Circuit Technology [online], Oct. 20-23, 2008 [retrieved on Feb. 23, 2010], pp. 329-332. Retrieved from the Internet:<URL: http://ieeexplore.ieee.org/stamp/stamp.jsp?tp=&arnumber=4734538&isnumber=4734459 > <DOI:10.1109/ICSICT.2008.4734538 >.

*Primary Examiner* — Jared Fureman
*Assistant Examiner* — Terrence Willoughby
(74) *Attorney, Agent, or Firm* — Knobbe, Martens, Olson & Bear, LLP

(57) ABSTRACT

Apparatus and methods for active detection, timing, and protection related to transient electrical events are disclosed. A detection circuit can generate a first activation signal in response to a transient electrical stress event across a first node and a second node. A blocking circuit is configured to bias the base of a first driver bipolar transistor to slow down discharge of accumulated base charge of a first driver bipolar transistor, which permits the first driver bipolar transistor to remain activated for a longer period of time than had the base of the first driver bipolar transistor been biased to the same voltage as the emitter of the first bipolar transistor. Shut-off circuitry can be included in some embodiments to prevent a discharge circuit from activating during normal operating conditions.

23 Claims, 12 Drawing Sheets

(56) References Cited

U.S. PATENT DOCUMENTS

| | | |
|---|---|---|
| 8,320,091 B2 | 11/2012 | Salcedo et al. |
| 8,422,187 B2 | 4/2013 | Parthasarathy et al. |
| 8,582,261 B2 | 11/2013 | Salcedo et al. |
| 8,730,630 B2 | 5/2014 | Parthasarathy et al. |
| 2002/0153571 A1 | 10/2002 | Mergens et al. |
| 2004/0114288 A1 | 6/2004 | Cheng et al. |
| 2006/0103998 A1 | 5/2006 | Smith |
| 2007/0076338 A1 | 4/2007 | Traynor et al. |
| 2008/0247102 A1 | 10/2008 | Vinson |
| 2008/0304191 A1 | 12/2008 | Riviere et al. |
| 2008/0316659 A1 | 12/2008 | Oguzman et al. |
| 2010/0214706 A1 | 8/2010 | Crespo et al. |
| 2011/0235228 A1 | 9/2011 | Salcedo et al. |
| 2012/0002337 A1 | 1/2012 | Parthasarathy et al. |

ACTIVE DETECTION AND PROTECTION OF SENSITIVE CIRCUITS AGAINST TRANSIENT ELECTRICAL STRESS EVENTS

BACKGROUND

1. Field

Embodiments of the invention relate to electronic systems, and more particularly, to transient electrical event protection circuits.

2. Description of the Related Technology

Certain electronic systems can be exposed to a transient electrical event, or an electrical signal of short duration having rapidly changing voltage and high power. Transient electrical events can include, for example, electro static discharge (ESD) events arising from the abrupt release of charge from an object or person to an electronic system.

Transient electrical events can destroy integrated circuits (ICs) due to overvoltage conditions and high levels of power dissipation in relatively small areas of the ICs. High power dissipation can increase IC temperature, and can lead to numerous problems, such as gate oxide punch-through, junction damage, metal damage, and surface charge accumulation. Transient electrical events can be a problem in a variety of applications, including, for example, in high performance radio frequency (RF) circuit applications. Thus, there is a need for providing protection over ICs in an electronic system from such transient electrical events.

SUMMARY

In one embodiment, an apparatus to provide transient electrical event protection is disclosed. The apparatus comprises a detection circuit, a driver circuit, a discharge circuit, and a first blocking circuit. The detection circuit can generate a first activation signal in response to a transient electrical stress event at a first node. The driver circuit, being operatively coupled to the detection circuit, can include a first driver bipolar transistor having a base, an emitter, and a collector. The first driver bipolar transistor can activate, saturate, and accumulate base charge in response to the first activation signal. The driver circuit can generate a second activation signal at least while the first driver bipolar transistor is activated. The discharge circuit can be coupled to the driver circuit and can activate a low impedance path between the first node and a second node at least while the driver circuit generates the second activation signal. The first blocking circuit can be coupled to the driver circuit and can be activated by the first activation signal. The first blocking circuit when activated can bias the base of the first driver bipolar transistor to a different voltage than the emitter of the first driver bipolar transistor, for a period of time after the first activation signal has ceased, to slow down discharge of accumulated base charge of the first driver bipolar transistor such that the first driver bipolar transistor remains activated for a longer period of time than had the base of the first driver bipolar transistor been biased to the same voltage as the emitter of the first bipolar transistor.

In another embodiment, the detection circuit includes a capacitor, a resistor, and a detection bipolar transistor having a base, an emitter, and a collector. The capacitor has a first terminal operatively coupled to the first node and a second terminal operatively coupled to the base of the detection bipolar transistor. The resistor is operatively coupled between the base and the emitter of the detection bipolar transistor. The emitter of the detection bipolar transistor is operatively coupled to the second node. The collector of the detection bipolar transistor is operatively coupled to the base of the first bipolar transistor. The resistor and the capacitor of the detection circuit can have a resistance R and a capacitance C, respectively, that results in an RC time constant substantially less than 1 μs.

In another embodiment, the apparatus further comprises a second blocking circuit and a second driver bipolar transistor of the driver circuit. The second driver bipolar transistor includes a base operatively coupled to the emitter of the first driver bipolar transistor, an emitter operatively coupled to the first node, and a collector operatively coupled to the discharge circuit. The second blocking circuit can be operatively coupled to the base of the second driver bipolar transistor. The second driver bipolar transistor can be configured to activate and to accumulate base charge in response to activation of the first driver bipolar circuit. The driver circuit can be configured to generate the second activation signal at least while the second driver bipolar transistor is activated. The second blocking circuit can be configured to activate in response to activation of the first driver bipolar transistor. The second blocking circuit when activated can be configured to bias the base of the second driver bipolar transistor to a different voltage than the emitter of the second driver bipolar transistor to slow down discharge of accumulated base charge of the second driver bipolar transistor such that the second driver bipolar transistor remains activated for a longer period of time than had the base of the second driver bipolar transistor been biased to the same voltage as the emitter of the second bipolar transistor.

In another embodiment, the first blocking circuit can be configured to reduce standing leakage and avoid activation of the first driver bipolar transistor in the absence of the transient electrical stress event. The first driver bipolar transistor can have a PNP structure. The first blocking circuit can bias the base of the first driver bipolar transistor by providing the base of the first driver bipolar transistor a reference voltage below the emitter voltage of the first driver bipolar transistor. The second activation signal can have a duration based at least partly on a duration of the first activation signal and on a duration of time that the first driver bipolar transistor retains its base charge.

In another embodiment, the discharge circuit can comprise a discharge PNP bipolar transistor having a base operatively coupled to the driver circuit, an emitter operatively coupled to the first node, and a collector operatively coupled to the second node. Additionally or alternatively, the discharge circuit can comprise a discharge NPN bipolar transistor having a base operatively coupled to the driver circuit, an emitter operatively coupled to the second node, and a collector operatively coupled to the first node.

In another embodiment, the driver circuit further includes a first load having a first terminal and a second terminal. The first terminal of the first load can be operatively coupled to the collector of the first driver bipolar transistor. The second terminal of the first load can be operatively coupled to the second node. The first driver bipolar transistor can have a PNP structure. The base of the first driver bipolar transistor can be operatively coupled to the first blocking circuit and to the detection circuit. The first load can include one or more diode-connected transistors operatively coupled in series between the first and second terminals of the first load. The first blocking circuit can include a first blocking resistor and a first blocking diode stack. The first blocking resistor and the first blocking diode stack can be operatively coupled in series between the first node and the base of the first driver bipolar transistor.

In another embodiment, the apparatus can further comprise a second blocking circuit operatively coupled to the driver circuit. The driver circuit further can include a second driver bipolar transistor and a second load. The second driver bipolar transistor can be operatively coupled to the second blocking circuit and between the first driver bipolar transistor and the discharge circuit. The second driver bipolar transistor can have a PNP structure and have a base, an emitter, and a collector. The base of the second driver bipolar transistor can be operatively coupled to the emitter of the first driver transistor and the second blocking circuit. The emitter of the second driver bipolar transistor can be operatively coupled to the first node. The collector of the second driver bipolar transistor can be operatively coupled to a first terminal of the second load. The second load can have a second terminal operatively coupled to the second node. The second blocking circuit can include a second blocking resistor and a second blocking diode stack, the second blocking resistor and the second blocking diode stack being operatively coupled in series between the first node and the base of the second driver bipolar transistor. The second load can include a resistor having a first terminal operatively coupled to the collector of the second driver bipolar transistor and a second terminal operatively coupled to the second node.

In yet other embodiments, the apparatus further comprises a voltage reference circuit having a voltage reference output and a first sensing terminal and a second sensing terminal, the first sensing terminal operatively coupled to the first node, the second sensing terminal being operatively coupled to the second node. The apparatus further comprises a field effect transistor having a base terminal and a first signal terminal and a second signal terminal, the base terminal being operatively coupled to the voltage reference output of the voltage reference circuit, the first signal terminal being operatively coupled to the first node, the second signal terminal being operatively coupled to the base of the second driver bipolar transistor. The voltage reference circuit can be configured generate a voltage reference signal to turn off the field effect transistor by the gate terminal in response to a transient electrical event, and can be configured to generate a voltage reference signal to turn on the field effect transistor by the gate terminal to bias the base of the second driver bipolar transistor at a voltage of the first node otherwise.

In yet other embodiments, the driver circuit further includes and a second driver bipolar transistor, a second load, and a first compensation capacitor. The second driver bipolar transistor has a base operatively coupled to the emitter of the first bipolar transistor and to the first node, a collector operatively coupled to a first terminal of the second load, and an emitter operatively coupled to the first node. The second load has a second terminal operatively coupled to the second node. The first compensation capacitor is operatively coupled across the base and collector of the first driver bipolar transistor. The detection circuit can include a detection capacitor having a first terminal and a second terminal, a detection resistor having a first terminal and a second terminal, a second compensation capacitor having a first terminal and a second terminal, and a detection NPN bipolar transistor having a base, an emitter, and a collector. The first terminal of the detection capacitor can be operatively coupled to the first node, the second terminal of the detection capacitor can be operatively coupled to the base of the detection NPN bipolar transistor, the first terminal of the detection resistor can be operatively coupled to the base of the detection NPN bipolar transistor, the second terminal of the detection resistor can be operatively coupled to the second node, the first terminal of the second compensation capacitor can be operatively coupled to the collector of the detection NPN bipolar transistor, the second terminal of the second compensation capacitor is operatively coupled to the base of the detection NPN bipolar transistor, the collector of the detection NPN bipolar transistor can be operatively coupled to the base of the first driver bipolar transistor, and the emitter of the detection NPN bipolar transistor can be operatively coupled to the second node.

In yet other embodiments, the apparatus further comprises a capacitor of the detection circuit, a resistor of the detection circuit, a detection bipolar transistor having a base, an emitter, and a collector, a voltage reference circuit having a voltage reference output and a first sensing terminal and a second sensing terminal, and a field effect transistor having a base terminal and a first signal terminal and a second signal terminal, the base terminal being operatively coupled to the voltage reference output of the voltage reference circuit. The capacitor can have a first terminal operatively coupled to the first node and a second terminal operatively coupled to a third node. The resistor can have a first terminal operatively coupled to the third node and a second terminal operatively coupled to the second node. The base can be operatively coupled to the third node. The emitter operatively can be coupled to the second node. The collector operatively can be coupled to the driver circuit. The first sensing terminal can be operatively coupled to the first node. The second sensing terminal can be operatively coupled to the second node. The first signal terminal can be operatively coupled to the base of the detection bipolar transistor. The second signal terminal can be operatively coupled to the base of the discharge bipolar transistor. The voltage reference circuit can be configured generate a voltage reference signal to turn off the field effect transistor by the gate terminal in response to a transient electrical event, and configured to generate a voltage reference signal to turn on the field effect transistor by the gate terminal to bias the base of the discharge bipolar transistor at the voltage of the base of the detector bipolar transistor otherwise.

In yet other embodiments, the apparatus further comprises a capacitor of the detection circuit, a resistor of the detection circuit, a detection bipolar transistor having a base, an emitter, and a collector, a voltage reference circuit having a voltage reference output and a first sensing terminal and a second sensing terminal, and a field effect transistor having a base terminal and a first signal terminal and a second signal terminal, the base terminal being operatively coupled to the voltage reference output of the voltage reference circuit. The capacitor can have a first terminal operatively coupled to the first node and a second terminal operatively coupled to a third node. The resistor can have a first terminal operatively coupled to the third node and a second terminal operatively coupled to the second node. The base can be operatively coupled to the third node. The emitter operatively can be coupled to the second node. The collector operatively can be coupled to the driver circuit. The first sensing terminal can be operatively coupled to the first node. The second sensing terminal can be operatively coupled to the second node. The first signal terminal can be operatively coupled to the second node. The second signal terminal can be operatively coupled to the base of the discharge bipolar transistor. The voltage reference circuit can be configured generate a voltage reference signal to turn off the field effect transistor by the gate terminal in response to a transient electrical event, and configured to generate a voltage reference signal to turn on the field effect transistor by the gate terminal to bias the base of the discharge bipolar transistor at the voltage of the base of the detector bipolar transistor otherwise.

In yet other embodiments, the apparatus further comprises a capacitor of the detection circuit, a resistor of the detection circuit, a detection bipolar transistor having a base, an emitter, and a collector, a voltage reference circuit having a voltage reference output and a first sensing terminal and a second sensing terminal, and a field effect transistor having a base terminal and a first signal terminal and a second signal terminal. The capacitor can have a first terminal operatively coupled to the first node and a second terminal operatively coupled to a third node. The resistor can have a first terminal operatively coupled to the third node and a second terminal operatively coupled to the second node. The base can be operatively coupled to the third node. The emitter can be operatively coupled to the second node. The collector can be operatively coupled to the driver circuit. The first sensing terminal can be operatively coupled to the first node. The second sensing terminal can be operatively coupled to the second node. The base terminal can be operatively coupled to the voltage reference output of the voltage reference circuit. The first signal terminal can be operatively coupled to the second node. The second signal terminal can be operatively coupled to the base of the discharge bipolar transistor. The voltage reference circuit can be configured generate a voltage reference signal to turn off the field effect transistor by the gate terminal in response to a transient electrical event, and can be configured to generate a voltage reference signal to turn on the field effect transistor by the gate terminal to bias the base of the discharge bipolar transistor at the voltage of the second node otherwise.

In another embodiment, an apparatus to provide transient electrical event protection is disclosed. The apparatus comprises a detection circuit configured to generate a first activation signal in response to a transient electrical stress event across a first node and a second node; a driver circuit operatively coupled to the detection circuit; a discharge circuit operatively coupled to the driver circuit and configured to activate a low impedance path between the first node and the second node at least while the driver circuit generates the second activation signal; and a means for biasing the base of the first driver bipolar transistor. The driver circuit can include a first driver bipolar transistor having a base, an emitter, and a collector. The first driver bipolar transistor can activate, saturate, and accumulate base charge in response to the first activation signal. The driver circuit is configured to generate a second activation signal at least while the first driver bipolar transistor is activated. The means for biasing the base of the first driver bipolar transistor can bias the base to a different voltage than the emitter of the first driver bipolar transistor to slow down discharge of the base charge of the first driver bipolar transistor such that the first driver bipolar transistor remains activated for a longer period of time than had the base of the first driver bipolar transistor been biased to the same voltage as the emitter of the first bipolar transistor.

In another embodiment, a method of transient electrical event protection is provided. The method comprises biasing a base of a second driver bipolar transistor of the driver circuit to a different voltage than the emitter of the second driver bipolar transistor in response to the first activation signal. The second driver bipolar transistor can be operatively coupled to the first driver bipolar transistor. The second driver bipolar transistor can activate and accumulate base charge in response to activation of the first driver bipolar transistor. The driver circuit generates the second activation signal at least while second driver bipolar transistor is activated. The biasing of the base of the second driver bipolar transistor can slow down discharge of accumulated base charge of the second driver bipolar transistor such that the second driver bipolar transistor remains activated for a longer period of time than had the base of the second driver bipolar transistor been biased to the same voltage as the emitter of the second bipolar transistor.

DETAILED DESCRIPTION OF EMBODIMENTS

Figure 1:
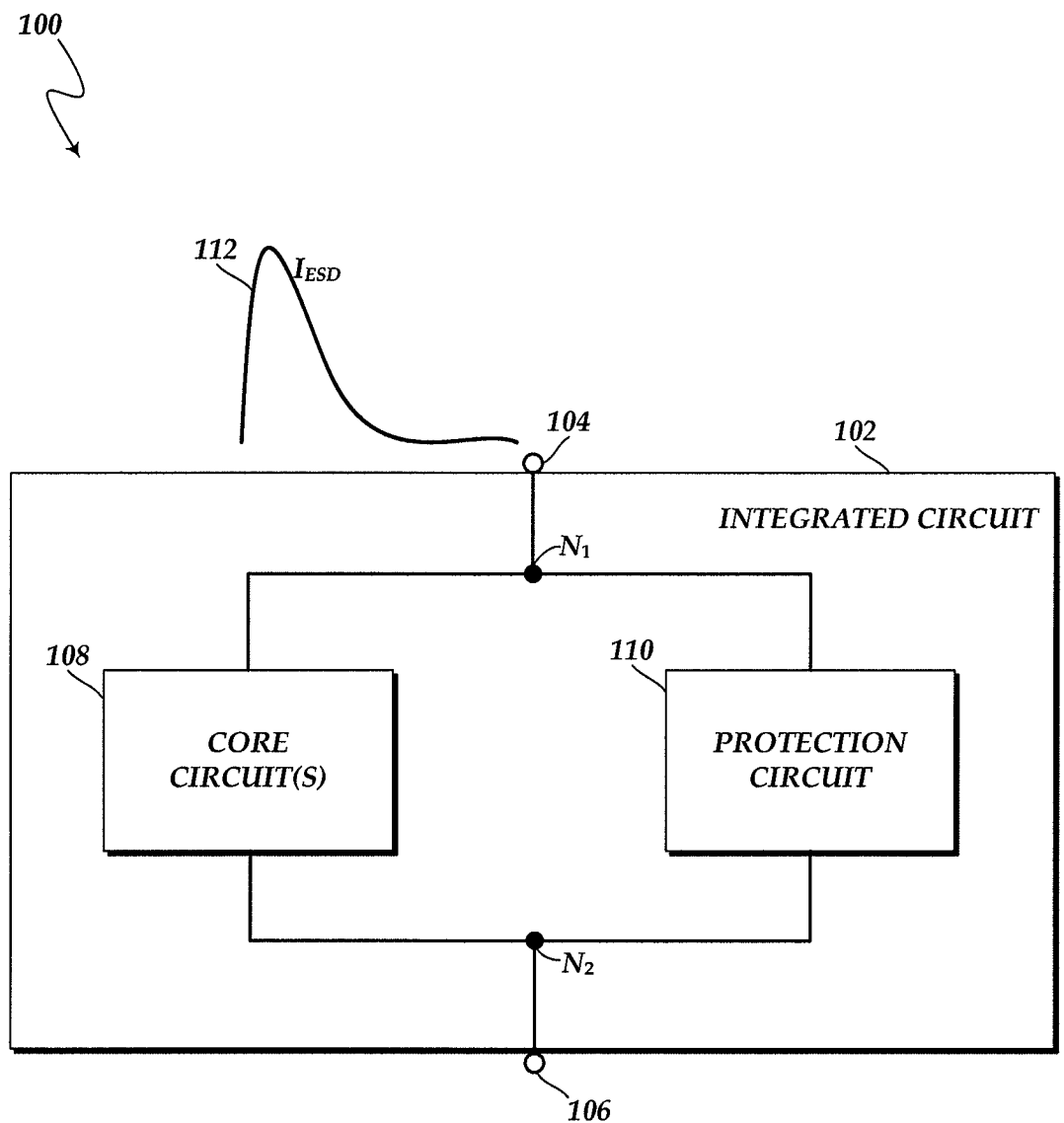
FIG. 1 is a schematic block diagram of an electronic system in accordance with one embodiment.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

An IC can include one or more pads which provide electrical connection between internal core circuits of the IC and external devices or circuits (for example, a printed circuit board, a power supply, and voltage references). These pads can render the IC vulnerable to transient electrical stress events ("transient electrical events")—including transient overvoltage, overcurrent, ESD, and the like events—that can disrupt or damage the core circuits of the IC. The time in which an electrical stress event can be disruptive or harmful to the core circuits can be generally be referred to the "stress time" of the event.

The reliability of such core circuits can be improved by providing pad protection circuits to the pads of an IC. Such a pad protection circuit can also be generally referred to as an "electronic protection circuit" (or simply "clamp") in this document. The pad protection circuits can maintain the voltage level at the pad within a predefined safe range, and can be configured to transition from a relatively high-impedance state providing relatively low leakage currents to a relatively low-impedance state when a transient electrical event is detected. Thereafter, the pad protection circuit can be configured to remain in the low-impedance state for a duration of time.

Some electronic protection circuits are configured to activate at a transient voltage above the circuit operating voltage, but below the breakdown of the sensitive core devices in the process. This protection mechanism is not suitable for some ICs. For example, ICs providing high-performance mixed-signal functionality can make use of complimentary SiGe BiCMOS process technologies having deep-submicron nodes (for example, with minimum feature size of 0.18 μm and beyond) and combine core and I/O MOSFET with SiGe Bipolar Junction Transistors (BJTs). The MOSFET devices can be configured to operate, for example, in the range of 1.2-3.3 V, whereas the SiGe BJTs can be configured to operate, for example, in the range of 0.5-8 V and at frequencies at or greater than 15-60 GHz. To achieve these desired electrical characteristics, core circuits may need to operate close to or at the breakdown voltage (for example, $BV_{CEO}$) of their BJTs. In such a scenario, electronic protection circuits using junction-breakdown triggered devices can be configured to trigger at a voltage that is 10 to 20% higher than the supply voltage to avoid triggering during normal operation. By relying on the direct junction breakdown, protection can be triggered post-breakdown of the core circuit, undermining the utility of the electronic protection circuit and leading to failures. Such failures may impact product release, delay time to market, or lead to products release with lower than target ESD rating.

Another approach is to trigger protection by detecting changes in the ESD transient voltage. MOS-based active clamps can be used, but in mixed-voltage circuits they may not be practical due to the comparatively low gate-oxide breakdown voltages of MOS devices. In particular, they may not protect a higher voltage SiGe bipolar-based circuit operating at voltages that are greater than the rated gate oxide breakdown voltage. Stacking of the MOS devices can allow electronic protection circuits to operate at voltages greater than the rated breakdown voltage of the gate oxide of an individual MOS device. However, besides the added complexity in the design, larger MOS devices can be used to offset the impact of stacking to achieve the required ESD rating. Another option to address this limitation includes replacing the MOS device with a BJT (NPN or PNP) device. This option provides area savings; however, using an NMOS/PMOS triggering element stacked appropriately to activate the final stage NPN/PNP can still limit the use of this supply clamp implementation approach for cases in which the operating voltage is within an acceptable range for the MOS control circuit.

There is therefore a need for a protection circuit that can detect transient electrical events without relying on direct junction breakdown to provide voltage clamping. Furthermore, there is a need for improved actively-controlled protection circuits which can be configured to provide transient electrical event protection under preselected conditions in a controlled and lasting manner, for mixed-voltage processes, and which have enhanced stability and robustness against false activation. Moreover, there is a need for a protection circuit having a relatively fast activation time, relatively low static power dissipation, and a relatively small area for low cost in, for example, medical and radio frequency (RF) applications.

In some embodiments, pad protection circuits can have relatively fast turn-on times and can be configured to enter a low-impedance state at a relatively low voltage without relying on direct junction breakdown. This can enhance protection against transient electrical events relative to a circuit in which a protection circuit clamps at a junction breakdown voltage, which may result in the transient electrical event reaching a voltage level higher than the breakdown voltage of devices internal to the IC. Some embodiments can be configured to provide transient electrical event protection under preselected conditions in a controlled and lasting manner, for mixed-voltage processes, and/or which have enhanced stability and robustness against false activation. Moreover, some embodiments can have a relatively fast activation time, relatively low static power dissipation, and/or small layout.

Electronic Systems Susceptible to Transient Electrical Events

FIG. 1 is a schematic block diagram of an electronic system 100, which can include one or more pad protection circuits according to some embodiments. The illustrated electronic system 100 includes an integrated circuit (IC) 102 that includes pins or pads 104, 106, a core circuit 108, and a protection circuit 110. The IC 102 also includes a first node $N_1$ and a second node $N_2$, which can be operatively coupled to one or more of the pads 104, 106, the core circuit 108, the protection circuit 110, or additional blocks not shown. Although the pads 104, 106, the core circuit 108, and the protection circuit 110 are shown as each being coupled to at least one of the first or second nodes $N_1$, $N_2$, in certain embodiments, not all of the illustrated connections are necessary.

The pads 104, 106 of the IC 102 can be coupled to the core circuit 108 and can, for example, be used for data communication, control signaling, power supply, biasing, configuration, and/or the like. Additionally, each of the pads 104, 106 can be, for example, a power pad, a ground pad, a unidirectional pad, and/or a bidirectional pad. For example, pad 104 can be coupled to a supply voltage and pad 106 can be coupled to ground, thereby providing power to circuits coupled across the first and second nodes $N_1$, $N_2$.

The core circuit 108, being operatively coupled to the first and second nodes $N_1$, $N_2$, can include one or more circuits of various functionalities. As a few non-limiting examples, among others, the core circuit 108 can be configured as a low-noise amplifier or a RF transceiver related to medical devices or RF/microwave applications.

The core circuit 108 can be exposed to a transient electrical event 112, such as ESD events, which can induce latch-up or cause damage. For example, the pad 104 of the IC 102 can receive the transient electrical event 112, which can travel along electrical connections of the IC 102 and reach the core circuit 108 via the first node $N_1$. Without a sufficient protection mechanism, the transient electrical event 112 can produce an overvoltage condition and cause the core circuit 108 to dissipate high levels of power, which can disrupt the functioning of, and potentially cause permanent damage to, the core circuit 108.

There are various models of transient electrical events. For example, the transient electrical event 112 can be an ESD event having a duration varying between 0.01 and 0.7 microseconds (μs) for the ESD HBM (Human Body Model) and CDM (Charged Device Model) ESD classification tests, respectively. These ESD events can be characterized by current rise times ranging from 0.2 to 10 nanoseconds (ns).

To ensure reliability and safety of the core circuit 108, the pad protection circuit 110 can be included in the IC 102. The pad protection circuit 110 can be configured to detect the transient electrical event 112 received on a pad of the IC 102, and to shunt a current associated with the transient electrical event 112 to other nodes or pads of the IC 102 during the course of the transient electrical event 112, thereby protecting the core circuit 108, as will be described in further detail below.

The pad protection circuit 110 can be placed between a power pad and a ground pad. Additionally, in certain embodiments, the pad protection circuit 110 can be placed in other configurations, including, for example, between a power pad and a second power pad, between a power pad and an input pad, between a power pad and an output pad, between a power pad and a bidirectional pad, between a ground pad and an input pad, between a ground pad and an output pad, between a ground pad and a bidirectional pad, between an input pad and a second input pad, between an input pad and an output pad, between an input pad and a bidirectional pad, between an output pad and a second output pad, between an input pad and a bidirectional pad, and/or between a bidirectional pad and a second bidirectional pad. When no transient electrical event is present, the pad protection circuit can remain in a high-impedance/low-leakage state, thereby reducing static power dissipation resulting from leakage current to an acceptable level.

The pad protection circuit 110 can be integrated on-chip with the IC 102. However, in other embodiments, the pad protection circuit 110 can be arranged in a separate IC. For example, the pad protection circuit 110 can be included in a separately packaged IC, or it can be encapsulated in a common package with the IC 102. In such embodiments, one or more pad protection circuits can be placed in a stand-alone IC, in a common package for system-on-a-package applications, or integrated with an IC in a common semiconductor substrate for system-on-a-chip applications.

The IC 102 can be used in, for example, high speed radio frequency (RF) systems, medical systems, transmission line systems, industrial control, power management systems, microelectromechanical system (MEMS) sensors, amplifiers, transducers, or a variety of other systems and applications. The IC 102 can be utilized in electronic systems in which the pins of the IC are exposed, for example, to IC assembly conditions that generate field-induced discharges, mechanical conductive tools for handling and testing, and/or direct user contact through a low-impedance connection.

Illustrative Pad Protection Circuits

FIGS. 2-10 are schematic diagrams illustrating actively-controlled protection circuits 110a-110i that can be used for the pad protection circuit 110 of FIG. 1 in accordance with various embodiments. Elements common to the various embodiments share common reference indicia, and only differences between the embodiments are described herein for the sake of brevity.

Figure 2:
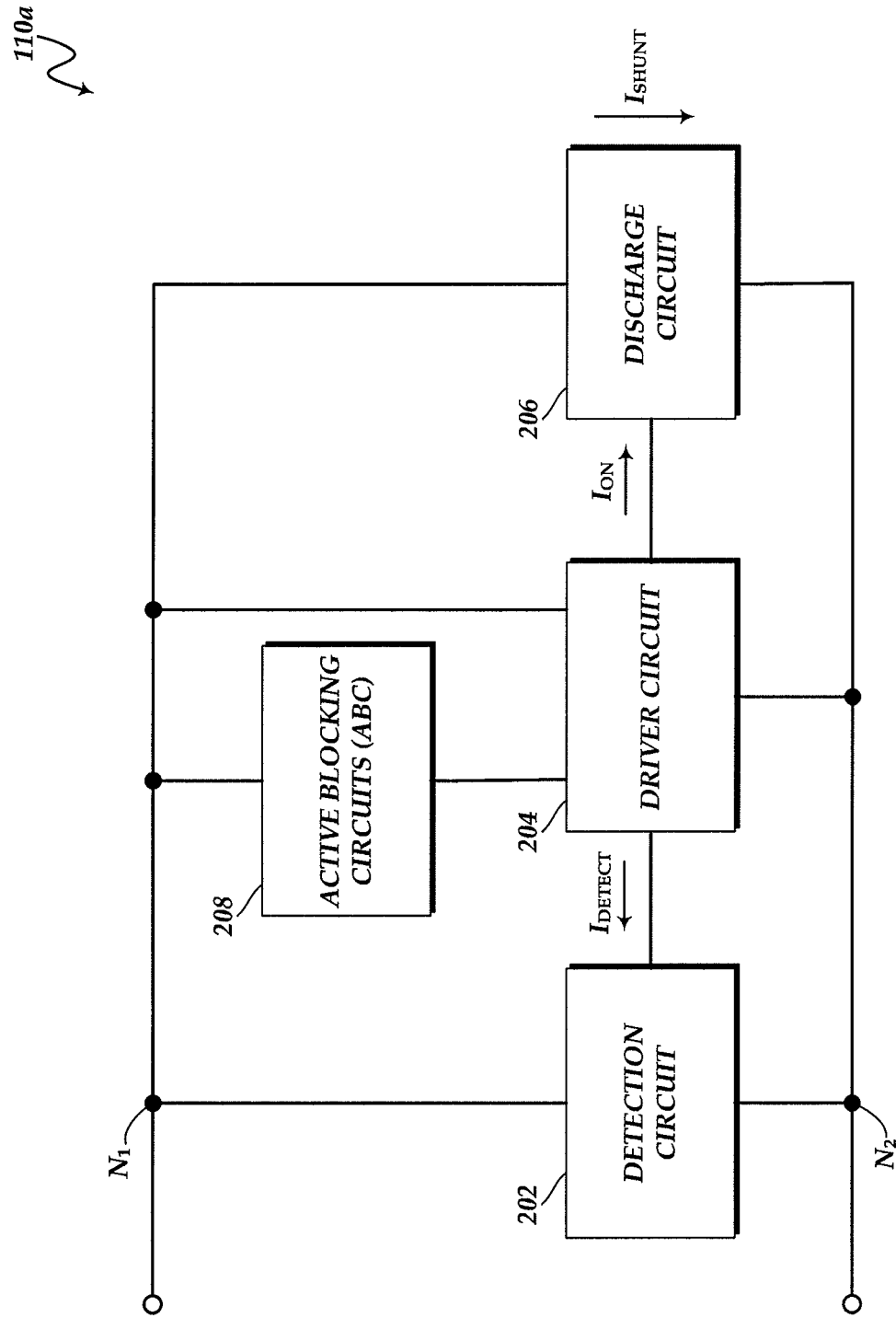
FIG. 2 is a schematic block diagram illustrating an actively-controlled protection circuit in accordance with embodiments.

FIG. 2 is a schematic block diagram illustrating an actively-controlled protection circuit 110a in accordance with some embodiments. As shown, the protection circuit 110a includes a detection circuit 202, a driver circuit 204, a discharge circuit 206, and an active blocking circuit 208 (or referred to as "blocking circuit," and labeled "ABC" in the Figures), each operatively coupled to the first node $N_1$, the second node $N_2$, or both. Although the detection circuit 202, the driver circuit 204, the discharge circuit 206, the blocking circuit 208 are shown as each being coupled to at least one of the first or second nodes $N_1$, $N_2$, in certain embodiments, not all of the illustrated connections are necessary.

As will be described in detail below, the protection circuit 110 can be configured to operate in a low-leakage/high-impedance state (or "OFF state") under normal operating conditions, and in a low-impedance state (or "ON state") in the presence of a transient electrical event. Upon detection of a transient electrical event, the detection circuit 202 activates and generates a first activation current $I_{DETECT}$ for some duration of time. In response to the first activation current $I_{DETECT}$, the driver circuit 204 activates and generates a second activation current $I_{ON}$ to activate the discharge circuit 206 for dissipation of the transient electrical event. In response to the second activation current $I_{ON}$, the discharge circuit 206 activates and operates in the ON state, thereby shunting a current $I_{SHUNT}$ away from the core circuit 108. Moreover, to maintain the discharge circuit 206 in the ON state during the course of the transient electrical event, the blocking circuit 208 can bias the driver circuit 204 to generate the second activation current $I_{ON}$ for a period of time after the first activation current $I_{DETECT}$ terminates.

The detection circuit 202 can include various circuitry configured to detect a transient electrical event on the first node $N_1$ and/or second node $N_2$, and to generate a first activation current $I_{DETECT}$ indicative of whether or not a transient electrical event has been detected. Detected events can include, but are not limited to, the following: observations of power, energy, voltage, charge, and rates of change thereof. For example, the detection circuit 202 can be configured to generate the first activation current $I_{DETECT}$ when the detection circuit 202 detects a rapidly changing voltage for a sufficient period of time on the first node $N_1$ and/or second node $N_2$, such as transient electrical signals having a rate of current change in the range of about 10 mA/ns to about 1 A/ns for a length of time in the range of about 2 ns to about 500 ns. In some embodiments, the detection circuit 202 is configured to remain deactivated for normal variations in the voltages of the first node $N_1$ and the second node $N_2$, including, for example, transients associated with inserting an IC into a live socket. One embodiment of the detection circuit 202 will be described below with reference to FIG. 3.

The first activation current $I_{DETECT}$ can have a duration less than the duration of the transient electrical event. For example, after detecting a transient electrical event and generating a first activation current $I_{DETECT}$, the detection circuit 202 can terminate or cease the first activation current $I_{DETECT}$ before the completion of the transient electrical event. The first activation current $I_{DETECT}$ has terminated or ceased when, for example, $I_{DETECT}$ no longer has a magnitude sufficient to maintain the driver circuit 204 in an activated state. In some embodiments, the duration of the first activation current $I_{DETECT}$ can be substantially less than the duration of the transient electrical event. For example, the detection circuit 202 can terminate the first activation current $I_{DETECT}$ while the transient electrical event is still potentially disruptive or harmful to the core circuit 108 (for example, during the stress time). After the first activation current $I_{DETECT}$ has terminated or ceased, the protection circuit 110 can still provide protection to the core circuit 108, where for example, the blocking circuit 208 maintains the driver circuit 204 in an activated state for a sufficient period of time after the first activation current $I_{DETECT}$ has terminated.

In one embodiment, the detection circuit 202 can include an RC circuit. It can be beneficial for cost to make the detection circuit 202 relatively small to occupy a relatively small amount of chip area. However, a reduction in a time constant associated with the RC circuit can reduce the length of time that the detection circuit 202 provides the first activation current $I_{DETECT}$. However, this can be ameliorated by the blocking circuit 208, as will be discussed in greater detail later in connection with FIG. 6.

In some embodiments, the detection circuit 202 can be configured to generate the first activation current $I_{DETECT}$ for a predetermined time period. For example, the predetermined time period can be less than a typical stress time of a transient electrical event, for example, a time ranging between about 25 ns to about 100 ns. For another example, the predetermined time period can be approximately equal or greater than a typical stress time of a transient electrical event, for example, a time ranging between about 100 ns to about 1000 ns.

The driver circuit 204 includes circuitry configured to generate a second activation current $I_{ON}$ capable of activating and/or driving the discharge circuit 206 into the ON state in response to the first activation current $I_{DETECT}$. For example, in some embodiments, the first activation current $I_{DETECT}$ may not have sufficient magnitude, or is deficient in some other aspect, to activate the discharge circuit 206. The driver circuit 204 can include one or more current amplifiers and/or buffers to generate the first activation current $I_{DETECT}$ in a manner sufficient to activate the discharge circuit 206. Further, in some embodiments, the driver circuit 204 can continue to generate the second activation current $I_{ON}$ for a period of time after the first activation current $I_{DETECT}$ has terminated. For example, as will be described in greater detail later, the duration of the second activation current $I_{ON}$ can be based at least partly on the duration of the second activation current $I_{ON}$ and on the action of the blocking circuit 208. Various embodiments of the driver circuit 204 will be described below with reference to FIG. 3-10.

The discharge circuit 206 can include circuitry configured to switch between, and operate in, the OFF state and the ON state in accordance with the second activation current $I_{ON}$. The OFF state impedance can be in, for example, the range of about 300 gigaohms (GΩ) to about 600 GΩ, thereby reducing or minimizing power consumption of the protection circuit 110 during normal operation. The shunt current $I_{SHUNT}$ of the ON state can be, for example, in the range of about 600 milliamps (mA) to about 3 amps (A), thereby aiding in protecting an IC from a transient electrical event. The circuitry of the discharge circuit 206 can be configured to remain in the ON state for a duration determined by the second activation current $I_{ON}$ as indicated above, and thereafter the discharge circuit 206 can return to the OFF state. Various embodiments of the discharge circuit 206 will be described below with reference to FIGS. 3 and 4.

In some embodiments, it can be desirable for the impedance of the protection circuit 110 to change by several orders of magnitude over a short amount of time. Thus, it can be desirable for the discharge circuit 206 to transition between the OFF state and the ON state in a relatively short amount of time, for example, between about 0.1 picoseconds (ps) and about 100 ps, and at a voltage less than that associated with over-voltage conditions, junction breakdown of internal devices, or damage to an IC. Although the first activation current $I_{DETECT}$ and second activation current $I_{ON}$ are shown as having a particular polarity, in certain embodiments, the polarity of each current can be reversed.

The blocking circuit 208 can include circuitry configured to maintain the driver circuit 204 in an active state to prolong or maintain the generation of the second activation current $I_{ON}$ for a period of time after the first activation current $I_{DETECT}$ has substantially terminated. For example, the blocking circuit 208 can be configured to activate in response to the first activation current $I_{DETECT}$ and/or the activation of the driver circuit 204. The blocking circuit 208 when activated can bias the driver circuit 204 such that deactivation of the driver circuit 204 is slowed, thereby increasing the duration of the second activation current $I_{ON}$. It can be beneficial to increase the duration of the second activation current $I_{ON}$. One benefit, among others, is the discharge circuit 206 can be more likely to remain ON during the stress time (for example, the period of time in which the transient electrical event can be disruptive or harmful to the core circuit 108). Various embodiments of the detection circuit 202 will be described below with reference to FIGS. 3, 8, and 9.

The blocking circuit 208 can, additionally or alternatively, include circuitry configured to reduce standing leakage and avoid activation of the driver circuit in the absence of a transient electrical event. For example, the blocking circuit 208 can be configured to increase a breakdown voltage of the driver circuit 204 when the first activation current $I_{DETECT}$ is not present and/or when the driver circuit 204 is deactivated (for example, by switching configurations from $BV_{CEO}$ to $BV_{CER}$).

Additionally or alternatively, in some embodiments, the blocking circuit 208/protection circuit 110 can include circuitry configured to provide shut-off functionality to prevent the protection circuit from mis-triggering during normal operation. An illustrative embodiment of shut-off circuits will be described later with references to FIGS. 9 and 10.

Figure 3:
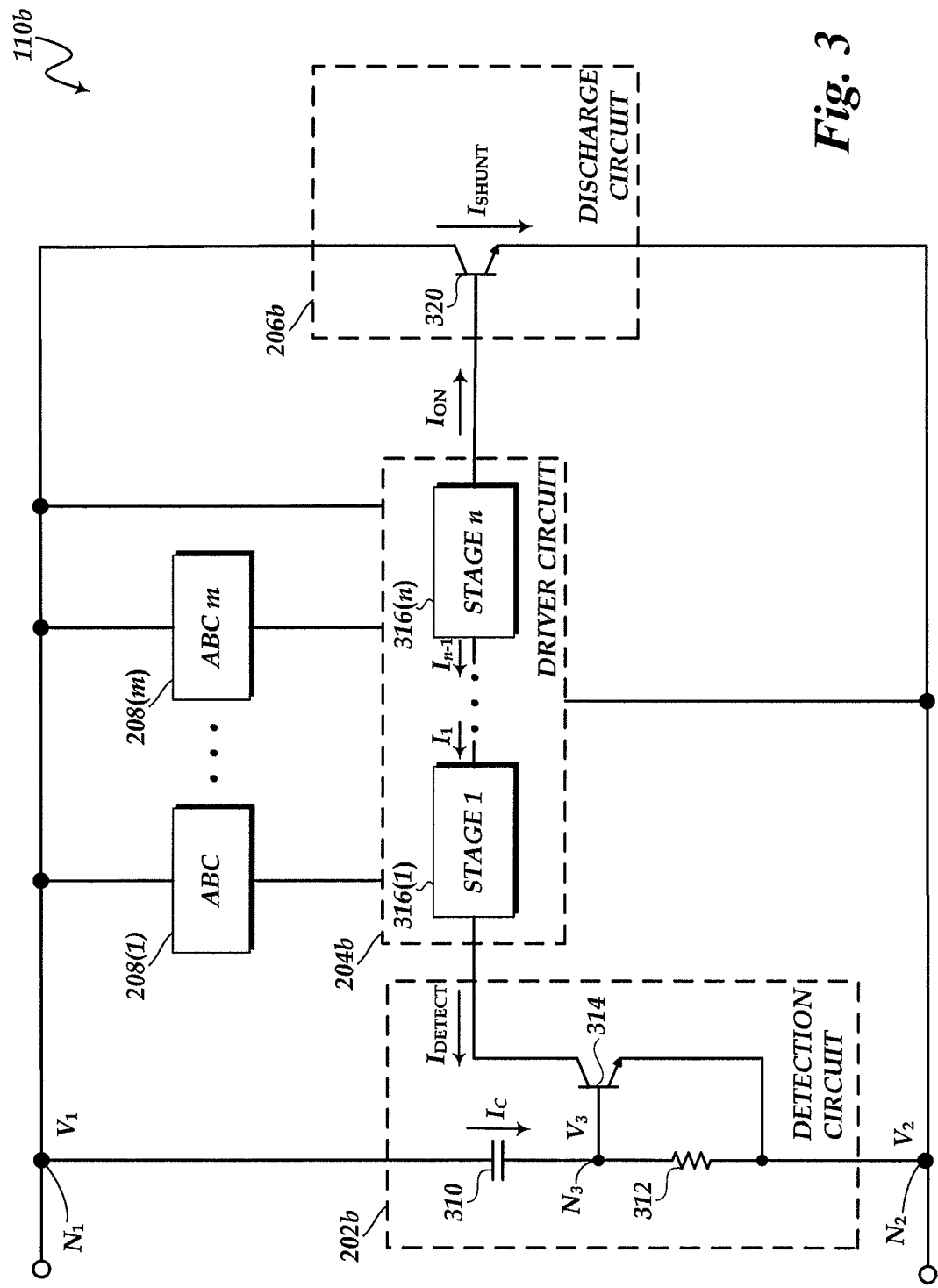
FIG. 3 is a circuit diagram illustrating an actively-controlled protection circuit in accordance with one embodiment.

FIG. 3 is a circuit diagram illustrating an actively-controlled protection circuit 110b in accordance with one embodiment. A detection circuit 202b includes a capacitor 310, a resistor 312, and an NPN bipolar transistor 314 having an emitter, a base, and a collector. The capacitor 310 includes a first terminal electrically coupled to the node $N_1$, and a second terminal electrically coupled to the base of the NPN bipolar transistor 314 and to a first end of the resistor 312 at a node $N_3$. The resistor 312 further includes a second end electrically coupled to the emitter of the NPN bipolar transistor 314 at the node $N_2$. The emitter of the NPN bipolar transistor 314 is electrically coupled to the node $N_2$, and the collector of the NPN bipolar transistor 314, being electrically coupled to the driver circuit 204b, can be configured to generate the first activation current $I_{DETECT}$.

The detection circuit 202b can be configured to generate the first activation current $I_{DETECT}$ in response to a transient electrical event having a particular rate of voltage change. For example, the first node $N_1$ can begin at a substantially constant supply voltage (for example, $V_{cc}$) and the second node $N_2$ can begin at a ground voltage. The current $I_C$ injected by the capacitor 310 can be approximately proportional to the rate of change $d(V_1-V_3)/dt$, where $V_1$ is the voltage at the first node $N_1$ and $V_3$ is the voltage at the third node $N_3$. Accordingly, during normal DC operating conditions, the current $I_C$ can be substantially zero. Furthermore, the voltage $V_3$ at the third node N3 can be substantially pulled down to the voltage $V_2$ of the second node $N_2$. Biased at the voltage $V_2$, the NPN bipolar transistor 314 can be configured to be deactivated and to provide substantially zero current $I_C$. A transistor is deactivated when, for example, it is in the cut-off region of operation.

When the first node $N_1$ experiences a rate of change of voltage of at least a particular magnitude for a sufficient duration due to a transient electrical event, the current through the resistor 312 can increase the voltage $V_3$ and forward bias the base-emitter junction of the NPN bipolar transistor 314, thereby activating (for example, entering into active-forward or saturation mode of operation) the NPN bipolar transistor 314 and generating a current first activation $I_{DETECT}$. Furthermore, the capacitor 310 charges as the voltage $V_3$ at the node $N_3$ increases, decreasing the current $I_c$ and returning the voltage $V_3$ of the node $N_3$ to about the voltage $V_2$ of the node $N_2$. The resistance of the resistor 312 can be selected such that the time it takes to charge the capacitor 310 can be substantially determined by the capacitance of the capacitor 310 and the magnitude of the first activation current $I_{DETECT}$, while functioning to bias the node $N_3$ at a voltage equal to about the voltage of the second node $N_2$ under steady-state DC conditions.

In one embodiment, the capacitance of the capacitor 310 is selected to be in the range of about 1.5 picofarads (pF) to about 3.5 pF, and the resistance of the resistor 312 is selected to be in the range of about 20 kiloohms (kΩ) to about 100 kΩ. Other applicable capacitances and resistances can be readily determined by one of ordinary skill in the art. The NPN bipolar transistor 314 can be sized appropriately for the current $I_1$. In one embodiment, the NPN bipolar transistor 314 has a total emitter area selected to be in the range of about 5 square micrometers ($\mu m^2$) to about 40 $\mu m^2$. For example, the NPN bipolar transistor 314 can have an emitter composed of four stripes, each stripe having a width of about 0.35 $\mu m$ and a length of about 20 $\mu m$. Other applicable emitter areas can be readily determined by one of ordinary skill in the art.

The illustrated driver circuit 204 can be configured to receive the first activation current $I_{DETECT}$, and to amplify the first activation current $I_{DETECT}$ to generate the second activation current $I_{ON}$. The driver circuit 204 can include n gain stages, such as the gain stages 316(1)-316(n). The number of gain stages n can be selected to be in the range of, for example, about 1 to about 10. Other numbers can readily be determined and used. In bipolar transistor embodiments, the number of gain stages can be selected based on, for example, common-emitter gain, common-collector gain, common-base gain, beta, and/or the cut-off frequency $F_t$ of the bipolar transistors. Further, although one or more stages may have a beta less than one (for example, the first stage can operate in a saturation mode) the overall gain of the driver circuit 204b can be greater than one. This beta multiplication can aid in designing a compact discharge device (for example, the NPN bipolar transistor 320). Various embodiments of the driver circuit 204 will be described below with reference to FIGS. 5-9.

The illustrated discharge circuit 206b includes a NPN bipolar transistor 320 having an emitter, a base, and a collector. The collector of the NPN bipolar transistor 320 is electrically coupled to the node $N_1$, and the emitter of the NPN bipolar transistor 320 is electrically coupled to the node $N_2$. The base of the NPN bipolar transistor 320 is configured to receive the second activation current $I_{ON}$ from the driver circuit 204. In response to the second activation current $I_{ON}$, the discharge circuit 206b can be configured to transition from the OFF state (for example, high-impedance/low-current state) to the ON state (for example, low-impedance/high-current state), thereby opening a current path between the first and second nodes $N_1$, $N_2$ and providing protection from a transient electrical event. In one embodiment, the NPN bipolar transistor 320 has a total emitter area selected to be in the range of, for example, about 300 $\mu m^2$ to about 3000 $\mu m^2$. Other emitter areas can be readily determined. For example, the NPN bipolar transistor 320 can include five bipolar devices operating in parallel, each device have an emitter composed of four stripes, each stripe having a width of about 1 $\mu m$ and a length of about 20 $\mu m$.

Using a NPN bipolar transistor for the final stage (for example, the discharge circuit 206b) can have various advantageous over other final stage designs. In some embodiments, an NPN bipolar transistor final stage can have high current handling capabilities per unit area of layout. Therefore, some embodiments can have a compact implementation and circuit layout.

The illustrated protection circuit 110b can include m separate blocking circuits, such as the blocking circuits 208(1)-208(m). The number of blocking circuits m can be selected to be in the range of, for example, about 1 to about 10. Other numbers, however, can readily be determined. For example, the number of blocking circuits m can be selected based on, the number of gain stages of the driver circuit 204, desired activation time (for example, relative to the duration of the first activation current $I_{DETECT}$), power consumption, and complexity and layout area considerations. In some embodiments, each of the m blocking circuits can be associated with one stage of the driver circuit 204. In other embodiments, one or more of the m blocking circuits can be associated with two or more stages of the driver circuit 204, for example, to bias a combination of the two or more stages using one blocking circuit. Various embodiments of the blocking circuits 208(1)-208(m) will be described below with reference to FIGS. 6-9.

Figure 4:
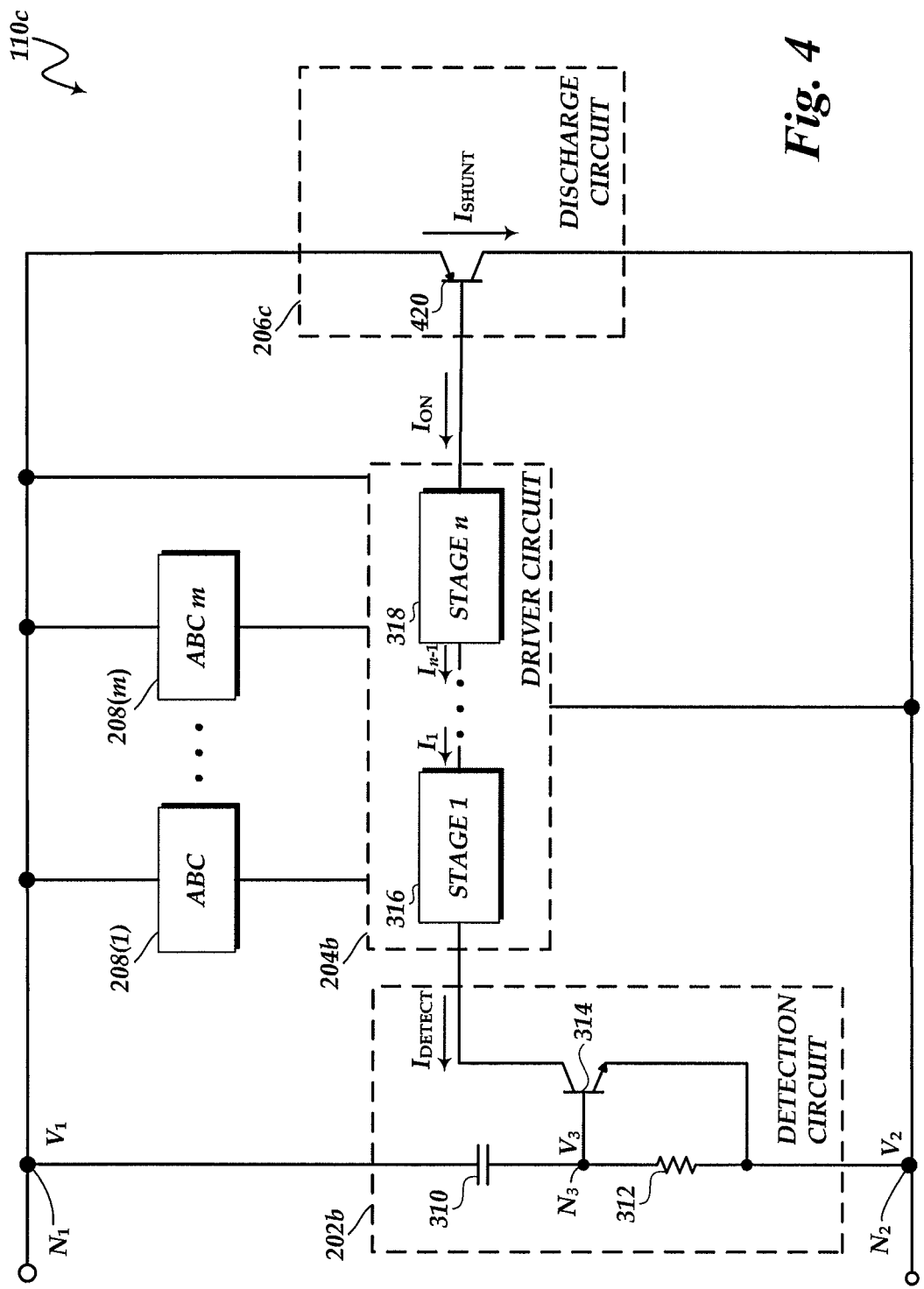
FIG. 4 is a circuit diagram illustrating an actively-controlled protection circuit in accordance with another embodiment.

FIG. 4 is a circuit diagram illustrating an actively-controlled protection circuit 110c in accordance with another embodiment. The illustrated protection circuit 110c includes the detection circuit 202b, the driver circuit 204b, a discharge circuit 206c, and the m blocking circuit 208(1)-208(m) electrically coupled between the first node $N_1$ and the second node $N_2$.

The discharge circuit 206c includes a PNP bipolar transistor 420 having an emitter electrically coupled to the first node $N_1$ and a collector electrically coupled to the second node $N_2$. The PNP bipolar transistor 38 further includes a base configured to receive the second activation current $I_{ON}$ from the driver circuit 204c. Similar to the PNP-based discharge circuit of FIG. 3, the discharge circuit 206 can be configured to transition from the OFF state (for example, high-impedance/low-current state) to the ON state (for example, low-impedance/high-current state) in response to the second activation current ION. In one embodiment, the PNP bipolar transistor 420 has a total emitter area selected to be in the range of, for example, about 300 $\mu m^2$ to about 3000 $\mu m^2$. Other applicable emitter areas can be readily determined by one of ordinary skill in the art. For example, the PNP bipolar transistor 420 can include five bipolar devices operating in parallel, each device have an emitter composed of four stripes, each stripe having a width of about 1 $\mu m$ and a length of about 20 $\mu m$.

Figure 5:
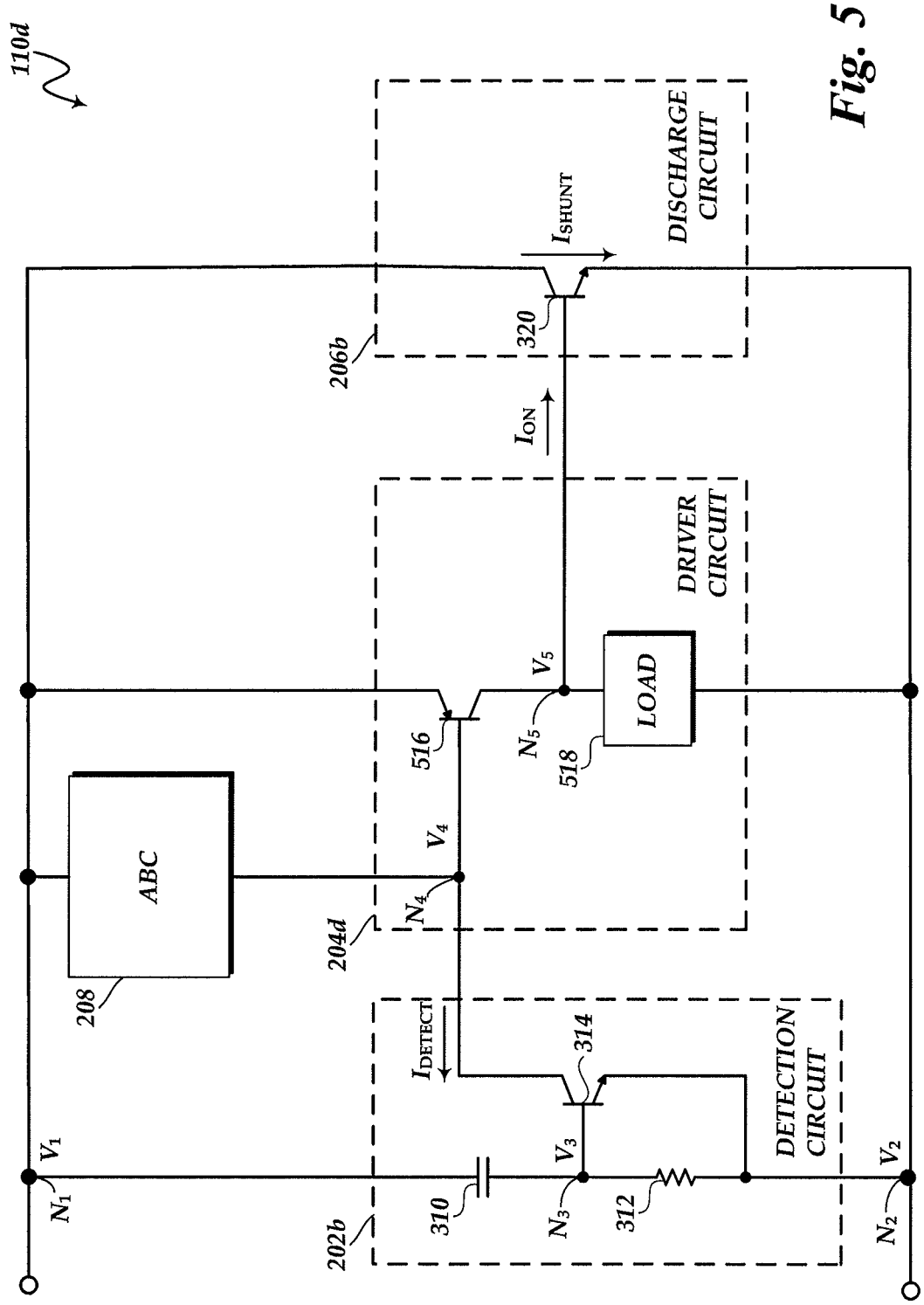
FIG. 5 is a circuit diagram illustrating an actively-controlled protection circuit in accordance with yet another embodiment.

FIG. 5 is a circuit diagram illustrating an actively-controlled protection circuit 110d in accordance with yet another embodiment. The illustrated protection circuit 110d includes the detection circuit 202b, a driver circuit 204d, the discharge circuit 206b, and the blocking circuit 208.

The illustrated driver circuit 204d includes a PNP bipolar transistor 516 having a having an emitter, a base, and a collector, and having a load 518. The emitter of the PNP bipolar transistor 516 is operatively coupled to the first node $N_1$. The base of the PNP bipolar transistor 516 is operatively coupled to the blocking circuit 208 and to the collector of the NPN bipolar transistor 314 at a fourth node $N_4$. The collector of the PNP bipolar transistor 516 is operatively coupled to a first terminal of the first load 518 and to the base of the discharge circuit 206b at a fifth node $N_5$. A second terminal of the first load 518 is operatively coupled to the second node $N_2$. In some embodiments the PNP bipolar transistor 516 has a total emitter area in the range of about 4 $\mu m^2$ to about 20 $\mu m^2$. Other applicable emitter areas can be readily determined by one of ordinary skill in the art.

The first load 518 can include passive and/or active electrical components configured to provide an impedance at the node $N_5$ looking into the first terminal of the first load 518. For example, the first load 518 can include one or more diodes, resistors, capacitors, inductors, current sources, and the like. Diodes can include, for example, P-N junction diodes and diode-connected transistors. In some embodiments, the first load 518 can aid in setting a gain (for example, a common-emitter gain) of the PNP bipolar transistor 516. In some embodiments, the first load 518 can be configured to aid in increasing the base-collector diffusion capacitance of the PNP bipolar transistor 516 when the PNP bipolar transistor 516 is activated, as described in connection with FIG. 6.

In operation, the detection circuit 202b is configured to generate the first activation current $I_{DETECT}$ in response to a transient electrical event, as described above. The first activation current $I_{DETECT}$ forward biases the base-emitter junction of the driver PNP bipolar transistor 516 into the saturation region, and the PNP bipolar transistor 516 thereby activates and accumulates base charge. In turn, the PNP bipolar transistor 516 generates the second activation current $I_{ON}$ and forward biases the base-emitter junction the NPN bipolar transistor 320 of the discharge circuit 206b, and the NPN bipolar transistor 320 thereby activates and opens a path for the shunt current $I_{SHUNT}$. In some embodiments, when the first activation current $I_{DETECT}$ activates the PNP bipolar transistor 516, the blocking circuit 208 is also activated and operates to bias the node $N_4$ and the base of the PNP bipolar transistor 516 to a different voltage than the emitter of the PNP bipolar transistor 516 after the first activation current $I_{DETECT}$ has ceased to be generated by the detection circuit 202b. By contrast, were a resistor to be used in place of the blocking circuit 208, the voltage at the base of the PNP transistor 516 would rapidly increase to approximately the same as the voltage at the emitter after the first activation current $I_{DETECT}$ dropped to zero. For example, the blocking circuit 208 can bias the base of the PNP bipolar transistor 516 to a reference voltage that can be a predetermined voltage drop from the voltage $V_1$ of the first node $N_1$, which slows down the depletion of the base charge relative to a situation in which the base and the emitter are at the same voltage. Further, the first load 518 can raise the voltage $V_5$ of the node $N_5$ above the voltage $V_2$ of node $N_2$. For example, the first load 518 can provide $N_5$ a reference voltage that can be a predetermined voltage increase from the second node $N_2$.

By operating in saturation mode, the collector-base diffusion capacitance of the PNP bipolar transistor 516 increases, which results in more accumulated base charge and slower discharge of the base charge. As a result, the PNP bipolar transistor 516 can remain activated (and, in turn, the discharge circuit 206b) for a period of time after the first activation current $I_{DETECT}$ terminates. Accordingly, since the PNP bipolar transistor 516 can remain activated for a period of time after the first activation $I_{DETECT}$ terminates, in some embodiments it is not necessary for the detection circuit 202b to generate the first activation current $I_{DETECT}$ for substantially the period of the stress time. Thus, the RC time constant of the detection circuit 202b can be reduced, resulting in a more compact protection circuit 110, which saves cost.

Figure 6:
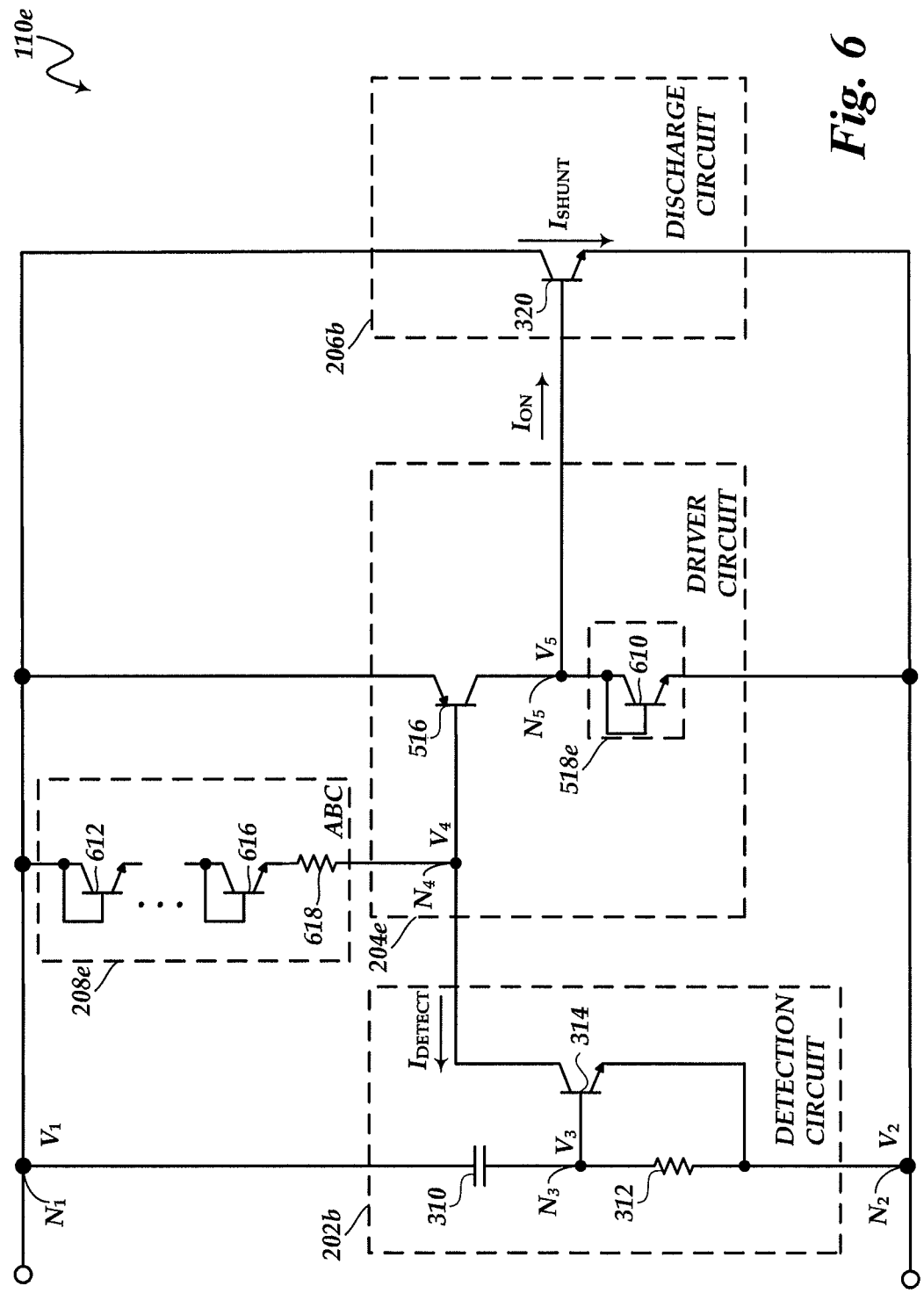
FIG. 6 is a circuit diagram illustrating an actively-controlled protection circuit in accordance with yet another embodiment.

FIG. 6 is a circuit diagram illustrating the actively-controlled protection circuit 110e in accordance with yet another embodiment. The illustrated protection circuit 110e includes the detection circuit 202b, the driver circuit 204e, the discharge circuit 206b, and the blocking circuit 208e. The illustrated detection circuit 202b, the driver circuit 204e, and the discharge circuit 206b are as described above with reference to FIGS. 3 and 5.

The blocking circuit 208e includes a first blocking resistor 618 and a first blocking diode stack comprising one or more diode connected NPN bipolar transistors 612-616. As shown in FIG. 6, the first blocking resistor 618 and the one or more diode connected NPN bipolar transistors 612-616 can be operatively coupled in series between the first node $N_1$ and the base of the PNP bipolar transistor 516. In some embodiments, first blocking resistor 618 has a resistance in the range of about 1 kΩ to about 20 kΩ. Other applicable resistances can be readily determined by one of ordinary skill in the art. In some embodiments, the number of diode-connected transistors 612-616 can be in the range of about 1 $\mu m^2$ to about 10 $\mu m^2$, based on desired voltage reference, layout, complexity, power consumption, and the like considerations. Other numbers of diode-connected transistors can be readily determined by one of ordinary skill in the art.

The first load 518e includes an NPN bipolar transistor 610 configured as a diode-connected transistor. In some embodiments, the NPN bipolar transistor 610 has total emitter area in the range of about 1 $\mu m^2$ to about 10 $\mu m^2$. Other applicable emitter areas can be readily determined by one of ordinary skill in the art.

In operation, during a transient electrical event the illustrated blocking circuit 208e can maintain the PNP bipolar transistor 516 in an activated state for a period of time after the first activation current $I_{DETECT}$ terminates. For example, as the first activation current $I_{DETECT}$ is initiated, the blocking circuit 208e activates and a current is drawn through the diode stack of the NPN bipolar transistors 612-616, generating a predetermined voltage drop (for example, approximately 0.7 V) across each of the diode connected NPN transistors 612-616.

The sum of the voltage drops of the diode stack 612-616 and the resistor 618 should be equal to the voltage drop from emitter to base of the PNP bipolar transistor 516. With current flowing through the blocking circuit 208e, the voltage drops of the diode stack 612-616 should be large relative to the voltage drop across the resistor 618 since the total voltage drop is clamped by the emitter to base voltage drop of the PNP bipolar transistor 516. Accordingly, the current drawn through the blocking circuit 208e can be relatively small and the voltage drop across the first blocking resistor 618 can be negligible relative to the voltage drop across diode stack of the diode-connected transistors 612-616. Accordingly the blocking circuit 208e can be configured to bias the base of the PNP bipolar transistor 516 by a predetermined voltage amount based on the voltage drop across the diode stack 612-616, substantially independent of the current drawn through the blocking circuit 208e. Eventually, the voltage drops across the diode stack 612-616 dissipates and the resistor 616 pulls the base of the PNP bipolar transistor 516 to the voltage of the node $N_1$.

Biasing the PNP bipolar transistor 516 in a manner as described above can have various benefits. One benefit, among others, is that biasing the base to a voltage lower than the emitter can increase the forward bias voltage of the emitter-base junction of the PNP bipolar transistor 516. Increasing the forward bias of the emitter-base junction can increase the base-emitter junction capacitance and the base charge accumulated by the PNP bipolar transistor 516 while activated. Further, by preventing the base of the PNP bipolar transistor 516 from being rapidly pulled up to the voltage of the emitter after the first activation current $I_{DETECT}$ terminates, the base of the PNP bipolar transistor 516 discharges more slowly than had its base been rapidly pulled up to the voltage of its emitter. Thus, the PNP bipolar transistor 516 can remain activated for a period of time after the first activation current $I_{DETECT}$ terminates, which in turn increases the time that the discharge circuit 206b remains in the ON state.

Additionally or alternatively, during normal conditions, the blocking resistor 618 can increase the breakdown voltage of the PNP bipolar transistor 516 to reduce standing leakage current. For example, in some embodiments, there is negligible current being pulled through the blocking circuit 208e under normal conditions. Thus the fourth node $N_4$ is pulled up to $V_1$, which is approximately the voltage of the emitter of the PNP bipolar transistor 516. Consequently, the transistor 516 operates with a breakdown voltage of $BV_{CER}$ (where $BV_{CER} > BV_{CEO}$). Furthermore, the resistor 618 can improve stability by attenuating high-frequency signals that could otherwise be coupled to the base of PNP bipolar transistor 516.

Now turning to the load 518e, in operation during a transient electrical event, the NPN bipolar transistor 610 can raise the voltage of the collector of the PNP bipolar transistor 516 above the voltage $V_2$ of the node $N_2$, which can further aid in retaining the base charge accumulated in the PNP bipolar transistor 516. Further, as a result, the discharge circuit 206b can be maintained in the ON state for a longer duration. For instance, the presence of the NPN bipolar transistor 610 in a diode-connected configuration can reduce the reverse bias voltages of the collector-base junctions of the PNP bipolar transistor 516 when biased in a forward-active mode. Reducing the reverse bias of the collector-base junction voltage in this manner can increase the depletion capacitance of the base-collector junction and can reduce the base current. The PNP bipolar transistor 516 will remain activated for a period of time after the first activation current $I_{DETECT}$ terminates and thereby increasing the ON time of the discharge circuit 206b.

In some embodiments, the blocking circuit and the load 518e are configured to saturate the PNP bipolar transistor 516 when the transistor 516 activates. For example, the blocking circuit 208e can provide a reference voltage at the base of the PNP bipolar transistor 516 that is lower than the voltage at node $N_5$, which is determined by the load 518e. Thus, saturation can be achieved by a proper selection of, for example, the number of diode-connected transistors 612-616 of the blocking circuit 208e. One benefit, among others, of biasing the PNP bipolar transistor 516 in saturation is that the base-emitter junction capacitance of the PNP bipolar transistor 516 can increase, as well as the amount of base charge accumulated. As stated, increasing the amount of base charge accumulated while activated can aid in keeping the PNP bipolar transistor 516 activated, and in turn the discharge circuit in the ON state, after the first activation current $I_{DETECT}$ has terminated.

Figure 7:
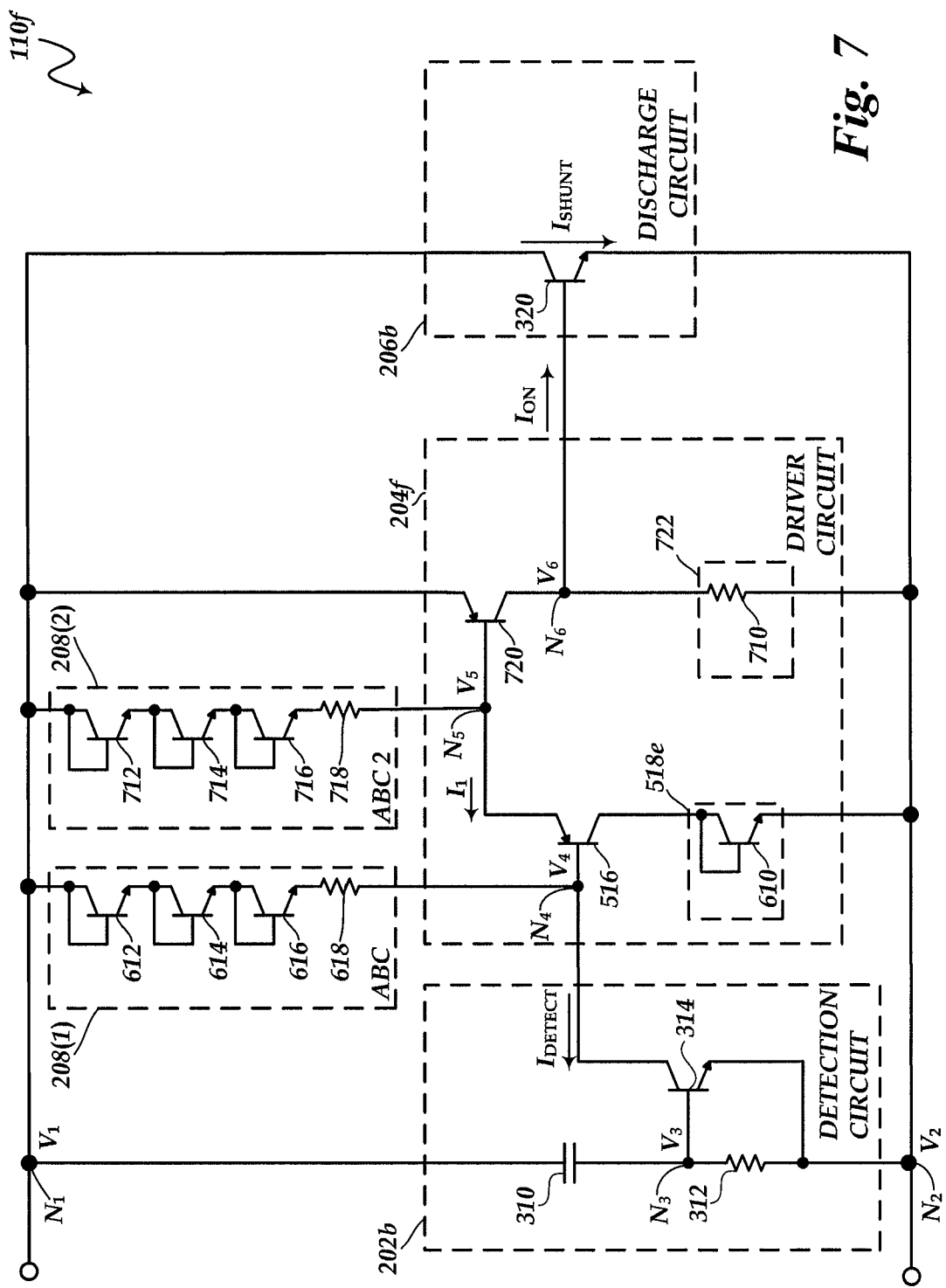
FIG. 7 is a circuit diagram illustrating an actively-controlled protection circuit in accordance with yet another embodiment.

FIG. 7 is a circuit diagram illustrating an actively-controlled protection circuit 110f in accordance with yet another embodiment. The illustrated protection circuit 110f includes a detection circuit 202b, a driver circuit 204f, a discharge circuit 206b, a first blocking circuit 208(1), and a second blocking circuit 208(2). The illustrated detection circuit 202b and discharge circuit 206b are as described above in connection with FIG. 3.

The illustrated driver circuit 204f includes a first PNP bipolar transistor 516 and a first load 518e coupled together as described above in connection with FIG. 6. The first load 518e includes a diode connected NPN bipolar transistor 610. The first PNP bipolar transistor 516 and a first load 518e can be a first stage of the driver circuit 204f (for example, Stage 1 316 as shown in FIG. 3).

The driver circuit 204f further includes a second stage comprising a second PNP bipolar transistor 720 and a second load 722. As shown, the second load 722 includes a resistor 710, but in some embodiments, the second load 722 can include other additional or alternative electrical components, such as diodes, transistors, inductors, capacitors, current sources, and the like. The second PNP bipolar transistor 720 has an emitter operatively coupled to the first node $N_1$, a base operatively coupled to the emitter of the first PNP bipolar transistor 516 at a fifth node $N_5$, and collector operatively coupled to the base of the NPN bipolar transistor 320 of the discharge circuit 206b at a sixth node $N_6$. The resistor 710 of the second load 722 has a first terminal operatively coupled to the collector of the second PNP transistor 720 at the sixth node $N_6$, and a second terminal operatively coupled to the second node $N_2$. The second PNP bipolar transistor 720 has a total emitter area in the range of about 4 $\mu m^2$ to about 20 $\mu m^2$. Other applicable emitter areas can be readily determined by one of ordinary skill in the art.

The first blocking circuit 208(1) includes a first blocking resistor 618 and a first blocking diode stack comprising three diode connected NPN bipolar transistors 612-616. As shown in FIG. 6, the first blocking resistor 618 and the three-diode connected NPN bipolar transistors 612-616 can be operatively coupled in series between the first node $N_1$ and the base of the PNP bipolar transistor 516 at the fourth node $N_4$. In some embodiments, each of the bipolar transistors 612-616 can have a total emitter area in the range of about 1 $\mu m^2$ to about 10 $\mu m^2$. Other applicable emitter areas can be readily determined by one of ordinary skill in the art.

The second blocking circuit 208(2) includes a second blocking resistor 718 and a second blocking diode stack comprising three diode connected NPN bipolar transistors 712-716. As shown in FIG. 7, the second blocking resistor 718 and the three diode-connected NPN bipolar transistors 712-716 can be operatively coupled in series between the first node $N_1$ and the base of the second PNP bipolar transistor 720 at the fifth node $N_5$. In some embodiments, each of the bipolar transistors 612-616 can have a total emitter area in the range of about 1 $\mu m^2$ to about 10 $\mu m^2$. Other applicable emitter areas will be readily determined by one of ordinary skill in the art. In some embodiments the resistance of the resistor 718 can be selected from the range of about 1 k$\Omega$ to about 20 k$\Omega$. Other values of resistance will be readily determined by one of ordinary skill in the art.

In operation, the detection circuit 202b is configured to generate the first activation current $I_{DETECT}$ in response to a transient electrical event. The first stage (the first PNP bipolar transistor 516 and the first load 518e of the driver circuit 204f and the first blocking circuit 208(1) can operate as described above with reference to FIG. 6. The first activation current $I_{DETECT}$ forward biases the base-emitter junction of the first PNP bipolar transistor 516 and causes the transistor 516 to generate the intermediate driver current $I_1$, which is pulled from to the collector of the PNP bipolar transistor 516. The intermediate driver current $I_1$ forward biases the second driver PNP bipolar transistor 720 such that the second driver PNP bipolar transistor 720 generates the second activation current $I_{ON}$. The second activation current $I_{ON}$ then activates the discharge NPN bipolar transistor 320 of the discharge circuit 206b.

When the first activation signal $I_{DETECT}$ is generated and the first driver PNP bipolar transistor 516 is activated, the first blocking circuit 208(1) can become activated and bias the base of the first driver PNP bipolar transistor 516 by providing a voltage reference that is approximately three diode drops from the voltage $V_1$ of the first node $N_1$. In some embodiments, the first driver PNP transistor 516 is configured to saturate in response to the first activation current $I_{DETECT}$.

Similarly, when the intermediate driver current $I_1$ is initiated and the second driver PNP bipolar transistor 720 can become activated. The second blocking circuit 208(2) can then become activated and can bias the base of the second driver PNP bipolar transistor 720 by providing a voltage reference that is approximately three diode drops below the voltage $V_1$ of the first node $N_1$, where each of the three diode drops is not necessarily a 0.7 V drop. In some embodiments, the second driver PNP transistor 720 is configured to saturate in response to the intermediate driver current $I_1$. In another embodiment, the second driver PNP transistor 720 is configured to operate in the active-forward mode in response to the intermediate driver current $I_1$.

Figure 8:
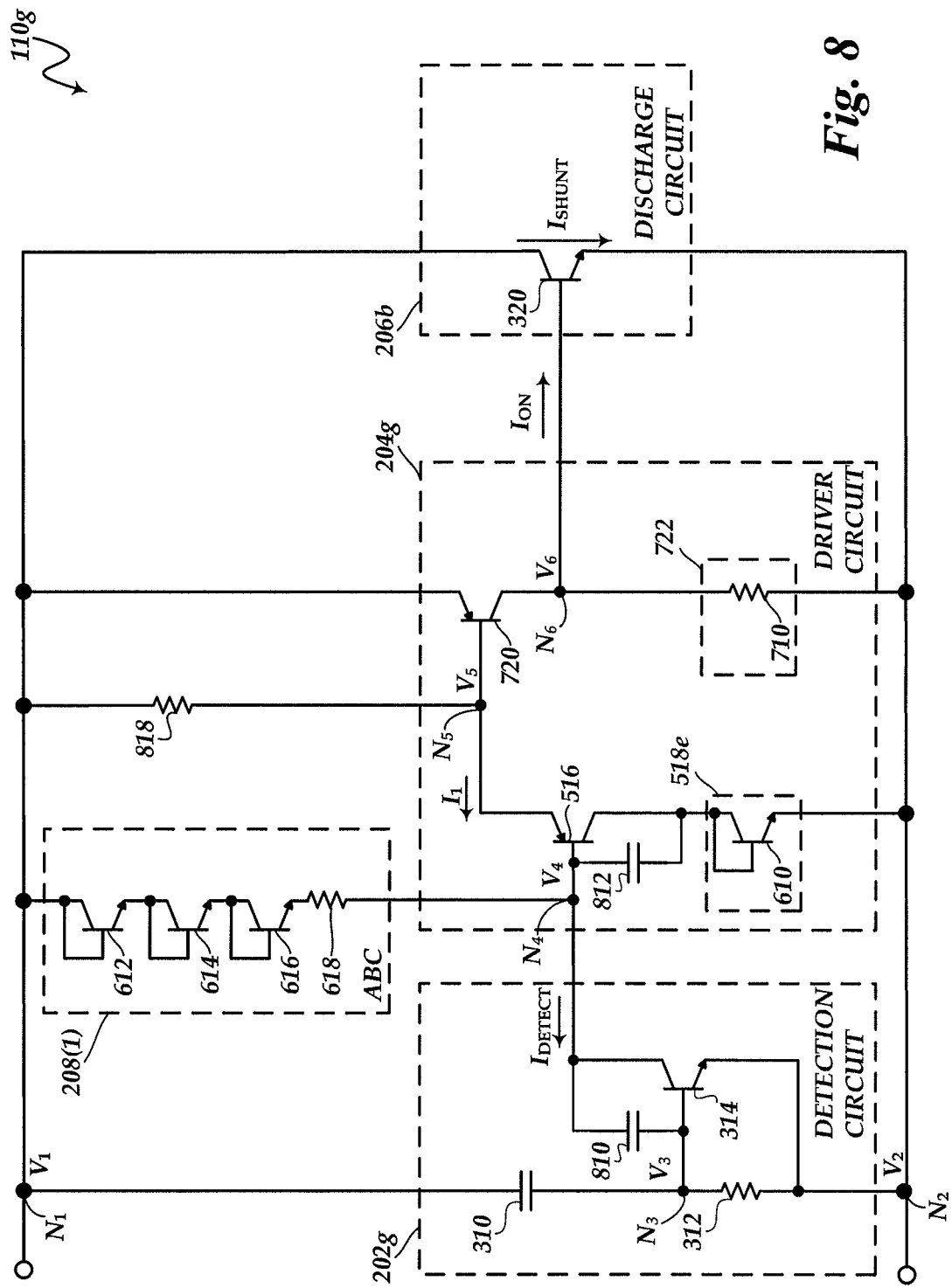
FIG. 8 is a circuit diagram illustrating an actively-controlled protection circuit in accordance with yet another embodiment.

FIG. 8 is a circuit diagram illustrating an actively-controlled protection circuit 110g in accordance with yet another embodiment. The illustrated protection circuit 110g includes a detection circuit 202g, a driver circuit 204g, a discharge circuit 206b, a blocking circuit 208(1), and a resistor 818.

The illustrated detection circuit 202g includes a detection capacitor 310, a detection resistor 312, and a detection NPN bipolar transistors 314 coupled as described above with reference to FIG. 3. Additionally, the detection circuit 202g includes a compensation capacitor 810. The compensation capacitor 810 includes a first terminal operatively coupled to the collector of the detection NPN bipolar transistor 314 at the fourth node $N_4$, and a second terminal operatively coupled to the base of the NPN bipolar transistor 314 at a third node $N_3$. In one embodiment, the capacitance of the capacitor 810 can be selected in the range of about 50 femtofarads (fF) to about 200 fF. Other applicable capacitances will be readily determined by one of ordinary skill in the art.

The illustrated driver circuit 204g includes a driver PNP bipolar transistor 516, a first load 518e including a diode connected transistor 610, a second driver PNP bipolar transistor 720, and a second load 722 including a load resistor 724 coupled as described above with reference to FIGS. 5-7. Additionally, the driver circuit 204g includes a second compensation capacitor 812. The compensation capacitor 812 includes a first terminal operatively coupled across the base and collector of the first driver PNP bipolar transistor 516. In one embodiment, the capacitance of the capacitor 812 can be selected in the range of about 50 fF to about 200 fF. Other applicable capacitances will be readily determined by one of ordinary skill in the art.

Including the first compensation capacitor 810 and the second compensation capacitor 812 can aid in increasing the turn off time of the transistors 314 and 516. Furthermore, the compensation capacitors 810, 812 can improve stability and reduce oscillations of the detection circuit 202g and the driver circuit 204g.

The resistor 818 has a first end operatively coupled to the first node $N_1$ and a second terminal operatively coupled to the base of the second driver PNP bipolar transistor 720. The resistor 818 can increase the breakdown voltage of the second driver PNP bipolar transistor 720 and reduce standing leakage current during normal operation. In one embodiment, the resistance of the resistor 818 can be selected in the range of about 1 kΩ to about 20 kΩ. Other applicable resistances will be readily determined by one of ordinary skill in the art.

In some applications, normal operating conditions can include high frequency signals on, for example, the supply. If the supply line is provided to the first node $N_1$ or the second node $N_2$, then a protection circuit may mis-trigger and activate when there is no danger of an electrical stress event that can cause malfunctioning or damage. Generally, noisy environments can make detection difficult. For example, the detection capacitor 310 can amplify high frequency noise and disturbances. There is therefore a need to have a protection circuit 110 capable operating robustly in the presence of noise, and if there is a false activation or a mis-triggering, then capable of rapidly recovering from the error.

Figure 9:
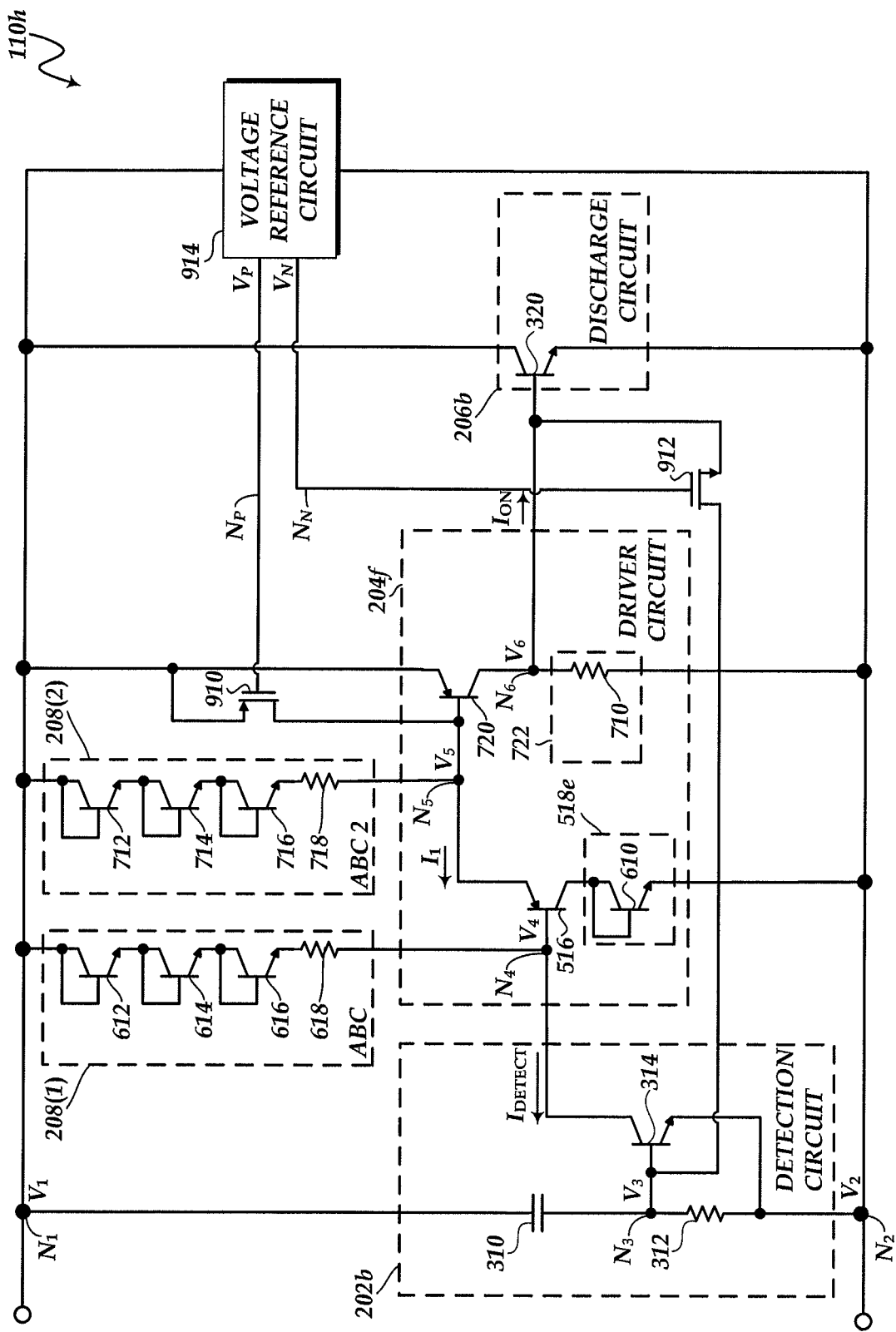
FIG. 9 is a circuit diagram illustrating an actively-controlled protection circuit in accordance with yet another embodiment.

With this need in mind, we now turn our focus to FIG. 9. FIG. 9 is a circuit diagram illustrating an actively-controlled protection circuit 110i in accordance with yet another embodiment. The illustrated protection circuit 110g includes a detection circuit 202b, a driver circuit 204f, a discharge circuit 206, a first blocking circuit 208(1), a second blocking circuit 208(2), an optional first shut-off FET 910, an optional second shut-off FET 912, and an optional voltage reference circuit 914. The FETs 910, 912 can correspond to insulated gate field-effect transistors, such as MOSFETs. However, it will be understood that a gate can be made from materials other than metals, such as polysilicon, and an insulation layer can be made out of materials other than silicon oxide, such as a high k dielectric. It will also be understood that transistors 910, 912 can have various structural types other than MOSFETs, including, but not limited to, BJT, JFET, IGFET, MESFET, pHEMT, HBT, and the like transistor structural types. Further, the transistors 910, 912 can also have various polarities, such as N-type, P-type, NPN-type, and PNP-type; and can include various semiconductor materials, such as GaAs, SiGe, and the like.

The detection circuit 202b includes a detection capacitor 310, a detection resistor 312, and a detection NPN bipolar transistor 314 coupled as described above with reference to FIG. 3. The driver circuit 204f includes a first PNP bipolar transistor 516, a first load 518e, a second PNP bipolar transistor 720, and a second load 722 as described in reference to FIG. 7.

The first shut-off FET 910 has a source operatively coupled to the first node $N_1$, a gate operatively coupled to the voltage reference circuit 914 at a node $N_P$, and a drain operatively coupled to the base of the second driver PNP bipolar transistor 720 at a fifth node $N_5$. In one embodiment, the first shut-off FET 910 is selected to have a length between about 0.18 μm to about 0.5 μm and a width between about 10 μm to about 100 μm. Other applicable lengths and widths will be readily determined by one of ordinary skill in the art.

The second shut-off FET 912 has a source operatively coupled to the base of the discharge NPN bipolar transistor 320 of the discharge circuit 206b at a sixth node $N_6$, a gate operatively coupled to the voltage reference circuit 914 at a node $N_N$, and a drain operatively coupled to the base of the detection NPN bipolar transistor 314 at a third node $N_3$. In one embodiment, the second shut-off FET 912 is selected to have a length between about 0.18 μm to about 0.5 μm and a width between about 10 μm to about 100 μm. Other applicable lengths and widths will be readily determined by one of ordinary skill in the art.

The voltage reference circuit 914 has a first terminal operatively coupled to a first node $N_1$, a second terminal operatively coupled to a second node $N_2$, a third terminal operatively coupled to the gate of the first shut off FET 910 at the node NP, and a fourth terminal operatively coupled to gate of the second shut-off FET 912 at the node $N_N$. As described below in further detail, the voltage reference circuit 914 can include various circuits to generate a first reference signal $V_P$ at node $N_P$ and a second reference signal $V_N$ at node $N_N$. Various embodiments of the voltage reference circuit 914 include band-gap voltage reference circuit, voltage dividers, and the like. For example, one embodiment of the voltage reference circuit 914 includes a capacitor based voltage divider circuit with a diode-plus-resistor stack tied to the midpoint of the voltage divider to maintain a valid DC operating point during circuit operation.

During normal operation the voltage reference circuit 914 is configured to generate the first reference signal $V_P$ as having a low voltage and the second reference signal $V_N$ as having a high voltage, such that both the first and second shut-off circuits are switched on. As a result of the first shut-off FET 910 being on, the base of the second driver PNP bipolar transistor 720 is biased to the voltage $V_1$ of the first node $N_1$, and the second driver PNP bipolar transistor 720 is thus configured to deactivate or shut off. Similarly, as a result of second shut-off FET 912 being on, the base of the discharge NPN bipolar transistor 320 is biased to the voltage $V_2$ of the first node $N_2$, and the discharge NPN bipolar transistor 320 is thus configured to deactivate or shut off. Accordingly, while both the first and second shut-down FETs 910, 912 are in the ON state, a false activation by the detection circuit 202b will not cause the discharge circuit to enter the ON state. Moreover, where the detection circuit 202b has erroneously activated the discharge circuit 206b, the discharge circuit 202b can be rapidly switched to the OFF state by switching on the shut-off FETs 910, 912 to reset the second PNP bipolar transistor 720 and the discharge NPN bipolar transistor 320 to the deactivated state.

Alternatively, during a transient electrical event the voltage reference circuit 914 is configured to generate the first reference signal $V_P$ on node $N_P$ as having a high voltage and the second reference signal $V_N$ on node $N_P$ as having a low voltage, such that both the first and second shut-off FETs configured to switch off. While both shut-off FETs 910, 912 are in the OFF state, these FETs 910, 912 have no significant operative effect on the actively-controlled protection circuit 110h, which then operates as described above in reference the protection circuit 110f of FIG. 7 during a transient.

Figure 10:
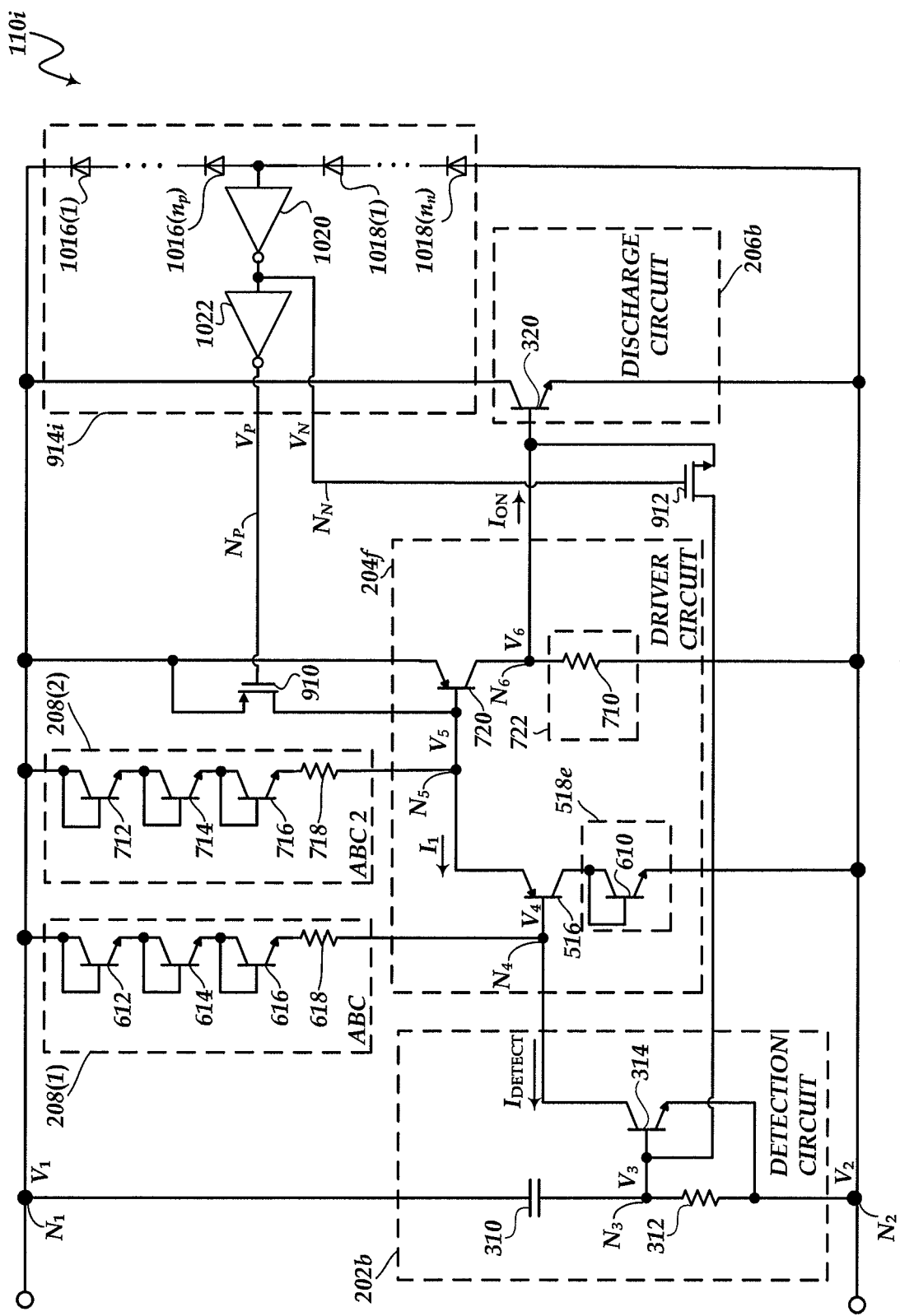
FIG. 10 is a circuit diagram illustrating an actively-controlled protection circuit in accordance with yet another embodiment.

FIG. 10 is a circuit diagram illustrating an actively-controlled protection circuit 110i in accordance with yet another embodiment. The illustrated protection circuit 110i includes a detection circuit 202b, a driver circuit 204f, a discharge circuit 206, a first blocking circuit 208(1), a second blocking circuit 208(2), a first shut-off FET 910, a second shut-off FET 912, and a voltage reference circuit 914 coupled as described above in connection with FIG. 9.

The voltage reference circuit 914i according to the illustrated embodiment includes a first diode stack of $n_p$ matched reverse-biased diodes $1016(1)$-$1016(n_p)$, a second diode stack of $n_n$ reverse-biased diodes $1018(1)$-$1018(n_n)$, a first inverter 1020, and a second inverter 1022. The first and second inverters 1020, 1022 can each include, for example, a CMOS inverter. As shown, the first diode stack of diodes $1016(1)$-$1016(n_p)$ and second diode stack of diodes $1018(1)$-$1018(n_n)$ are coupled in series between the first node $N_1$ and the second node $N_2$ in a reverse-biased configuration. The first inverter 1020 has an input coupled to a node between the first and second stacks of diodes $1016(1)$-$1016(n_p)$, $1018(1)$-$1018(n_n)$, and an output coupled to the node $N_N$ and an input of the second inverter 1022. The second inverter has an output coupled to the node N. The first inverter 1020 and second inverter 1022 aid in maintaining the voltages at nodes $N_P$ and $N_N$ at complementary HIGH and LOW signals (for example, HIGH and LOW voltage levels) in accordance with the voltage at the node between the first and second stack of diodes $1016(1)$-$1016(n_p)$, $1018(1)$-$1018(n_n)$.

Because the diodes $1016(1)$-$1016(n_p)$ are matched, the voltage drops due to leakage currents should likewise be matched. These diodes $1016(1)$-$1016(n_p)$ implement a low-leakage voltage divider. Alternatively, the diodes $1016(1)$-$1016(n_p)$ can be replaced with resistors, but the resulting leakage current can be expected to be larger. In one embodiment the number $n_p$ of diodes in the first diode stack can be in the range of about 2 to about 10, and the number $n_n$ of diodes in the second diode stack can be in the range of about 2 to about 10. Other values for $n_p$ and $n_n$ can be determined based on various considerations, such as supply voltage, layout, complexity, power consumption, current leakage, and the like.

As described above, in operation the voltage reference circuit 914i can generate reference signals $V_P$ and $V_N$ that turn on FETs 910 and 912, respectively, during normal operation. For example, during normal operation where there is a relatively constant supply voltage across the node $N_1$ and the node $N_2$, the first diode stack of $n_p$ diodes $1016(1)$-$1016(n_p)$ and the second diode stack of $n_n$ diodes $1018(1)$-$1018(n_n)$ are in an OFF state and there is relatively little current flowing through the diodes. Thus, the inverter 1020 generates a HIGH signal at the node $N_N$, and the inverter 1022 generates a LOW signal at N. The voltage $V_P$ developed at node $N_P$ can be approximately 10 V to approximately 100 millivolts (mV), and the voltage $V_N$ at node $N_N$ can be approximately 2 V to approximately 4 V. Such voltages at $N_P$ and $N_N$ can activate the FETs 910, 912, which pulls the node $N_5$ to the voltage $V_1$ (for example, $V_{CC}$), and pulls the node $N_6$ to the voltage $V_2$ (for example, $V_{EE}$), and which thereby shuts off the protection circuit 110i. Accordingly, the voltage reference circuit 914i and the shut-off FETs 910, 912 can aid in preventing and rapidly recovering from false activations.

During transient electrical events, the voltage reference circuit 914i can generate reference signals $V_P$ and $V_N$ that turn off FETs 910 and 912, respectively. For example, a rapid change in the voltage at the node $N_1$ can generate a displacement current through the first diode stack of $n_p$ diodes $1016(1)$-$1016(n_p)$ and the second diode stack of $n_n$ diodes $1018(1)$-$1018(n_n)$, which results in voltage drops across the diodes. Thus, the inverter 1020 generates a LOW signal at node $N_N$, and the inverter 1022 generates a HIGH signal at the node N. In one embodiment, the voltage $V_p$ developed at the node $N_P$ can be approximately 1.5 V to approximately 3 V and the voltage $V_N$ at the node $N_N$ can be approximately 10 mV to approximately 200 mV during an ESD event. At such voltages the FETS 910 and 912 deactivate, which allows the protection circuit 110i to operate as described above with reference the protection circuit 110f of FIG. 7 during a transient electrical event.

Figure 11A:
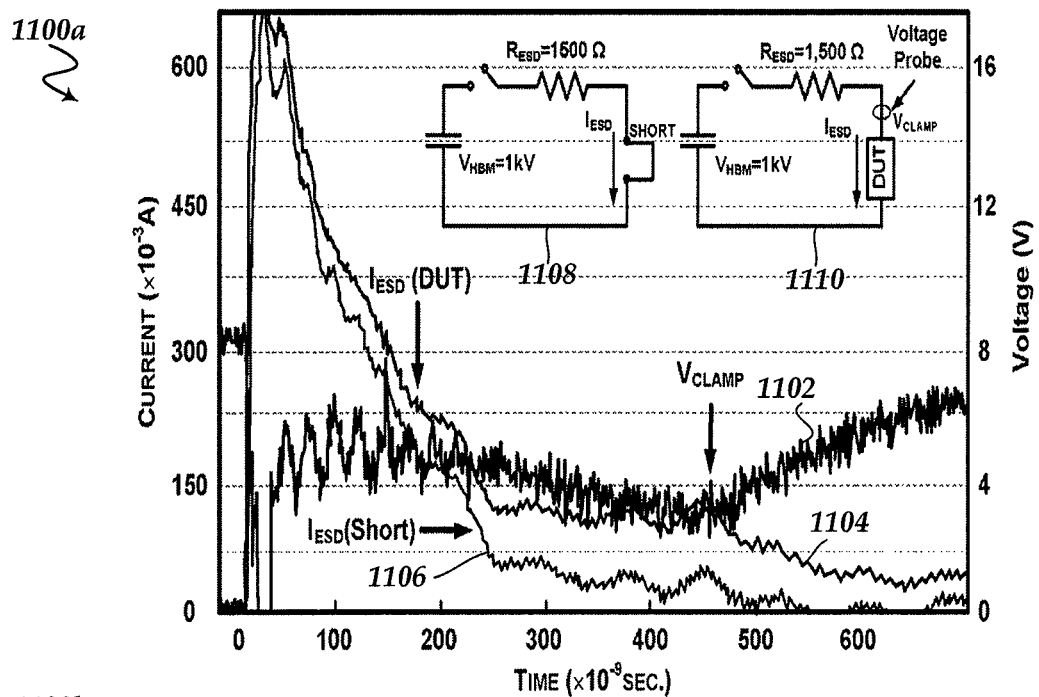
FIG. 11A is a graph of clamp voltage and transient currents versus times for one example of a pad protection circuit.

FIG. 11A is a graph 1100a of a SPICE simulation of one example of a pad protection circuit, such as the protection circuit 110f of FIG. 7. The graph 1100a illustrates the operation of the protection circuit 1100 during a 1000 V Human-Body-Model (HBM) ESD impulse over a 1 µs duration. The illustrated graph 1100a includes a plot 1102 of clamp voltage $V_{CLAMP}$ versus time, a plot 1104 of $I_{ESD}$(DUT) versus time, and a plot 1106 of $I_{ESD}$(Short) versus time. Here, the clamp voltage $V_{CLAMP}$ represents the voltage across the discharge circuit 206 (for example, $V_1$-$V_2$ in FIG. 7). The current $I_{ESD}$ (Short) represents the current discharged by the HBM model where the protection circuit 110 and the core circuit 108 are replaced with a short, as shown in the circuit diagram 1108. The current $I_{ESD}$(DUT) represents the current discharged by the protection circuit (approximately $I_{SHUNT}$), as shown in the circuit diagram 1110. The plot 1106 illustrates the protection circuit 110 can maintain relatively low voltages across the protection circuit 110 during the course of a transient electrical event, particularly when $I_{ESD}$(DUT) is significant.

Figure 11B:
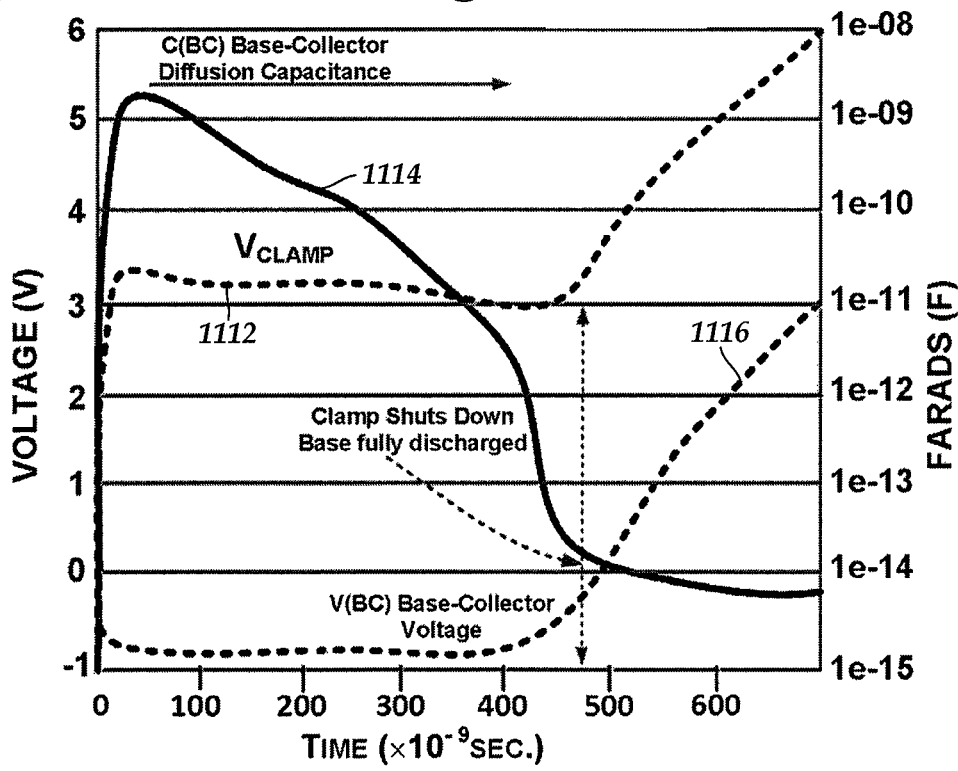
FIG. 11B is a graph of clamp voltage, base-collector voltage, and base collector diffusion capacitance versus time one example of a pad protection circuit.

FIG. 11B is a graph 1100b of a SPICE simulation similar to the simulation shown in FIG. 11A. Like the graph of FIG. 11A, the graph 1100b illustrates the operation of the pad protection circuit 110 during a 1000 V HBM ESD impulse over a 1 µs duration. The illustrated graph 1100b includes a plot 1112 of clamp voltage $V_{CLAMP}$ versus time, a plot 1114 of collector-base diffusion capacitance $C_{BC}$ versus time, and a plot 1116 of base-collector voltage $V_{BC}$ versus time. Here, the capacitance $C_{BC}$ and the voltage $V_{BC}$ is associated with the first driver PNP bipolar transistor 516 of the FIG. 7. The plots 1112-1116 illustrate the effect of increasing the diffusion capacitances of the transistors of the driver circuit 204.

Figure 12:
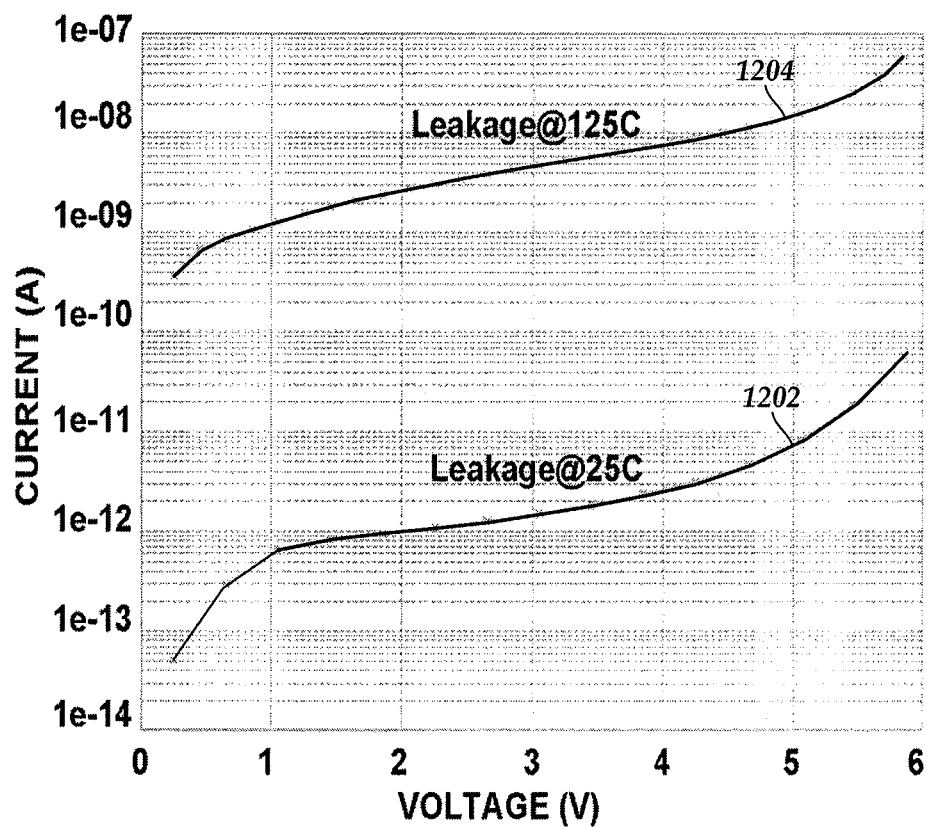
FIG. 12 is a graph of standing leakage current versus clamp voltage for one example of a pad protection circuits at two temperatures.

FIG. 12 is a graph 1200 of a DC SPICE simulation for a protection circuit of one example of a pad protection circuit, such as the pad protection circuit 110$f$ of FIG. 7. The graph 1200 illustrates the current-voltage characteristics of the pad protection circuit 110 with respect to temperature variations to demonstrate the leakage current of the protection circuit 110 during normal operation. The illustrated graph 1200 includes a plot 1202 of leakage current versus voltage ($V_1$-$V_2$) at 25° C. The illustrated graph 1200 also includes a plot 1204 of leakage current versus voltage ($V_1$-$V_2$) at 125° C. FIG. 12 demonstrates the low standing leakage current capabilities of the protection circuit 110, even at high temperatures. One aspect of the present disclosure that helps in achieving low leakage current is the utilization of the resistors 618 and 718. The diode stacks of the first and second blocking circuits 208(1), 208(2) showed small voltage drops across them during standard circuit operation due to the negligible current flow through the blocking circuits. As a result, the resistors 618 and 718 can effectively pull up the nodes $N_4$ and $N_5$ to $V_1$, causing transistors 516 and 720 to operate in a $BV_{CER}$ condition (where $BV_{CEO} < BV_{CER} < BV_{CBO}$).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, base stations, communication modems, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

Some of the embodiments disclosed herein have been described with specific signals implemented as current-mode or voltage-mode signals, but the inventive principles also contemplate other types of signals, whether characterized as voltages or currents. Likewise, some semiconductor devices are described as being specifically NPN or PNP BJTs, but in many cases different polarities or different device and/or structural types such as J-FETs and/or insulated-gate transistors (for example, MOS transistors) can also be utilized.

Moreover, the foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

What is claimed is:

1. An apparatus comprising:
   a detection circuit configured to generate a first activation signal in response to a transient electrical stress event at a first node;
   a driver circuit operatively coupled to the detection circuit, the driver circuit including a first driver bipolar transistor having a base, an emitter, and a collector, wherein the first driver bipolar transistor is configured to activate, saturate, and accumulate base charge in response to the first activation signal, and wherein the driver circuit is configured to generate a second activation signal at least while the first driver bipolar transistor is activated;
   a discharge circuit operatively coupled to the driver circuit and configured to activate a low impedance path between the first node and a second node at least while the driver circuit generates the second activation signal; and
   a first blocking circuit operatively coupled to the driver circuit and configured to be activated by the first activation signal, wherein the first blocking circuit is configured to bias the base of the first driver bipolar transistor to a different voltage than the emitter of the first driver bipolar transistor for a period of time after the first activation signal has ceased to slow down discharge of accumulated base charge of the first driver bipolar transistor such that the first driver bipolar transistor remains activated for a longer period of time than had the base of the first driver bipolar transistor been biased to the same voltage as the emitter of the first bipolar transistor.

2. The apparatus of claim 1, wherein the detection circuit includes a capacitor, a resistor, and a detection bipolar transistor having a base, an emitter, and a collector, wherein the capacitor has a first terminal operatively coupled to the first node and a second terminal operatively coupled to the base of the detection bipolar transistor, the resistor is operatively coupled between the base and the emitter of the detection bipolar transistor, the emitter of the detection bipolar transistor is operatively coupled to the second node, and the collector of the detection bipolar transistor is operatively coupled to the base of the first bipolar transistor.

3. The apparatus of claim 2, wherein the resistor and the capacitor of the detection circuit have a resistance R and a capacitance C, respectively, that results in an RC time constant substantially less than 1 μs.

4. The apparatus of claim 1, further comprising a second blocking circuit and a second driver bipolar transistor of the driver circuit, wherein the second driver bipolar transistor includes a base operatively coupled to the emitter of the first driver bipolar transistor, an emitter operatively coupled to the first node, and a collector operatively coupled to the discharge circuit, wherein the second blocking circuit is operatively coupled to the base of the second driver bipolar transistor, wherein the second driver bipolar transistor is configured to activate and to accumulate base charge in response to activation of the first driver bipolar circuit, wherein the driver circuit is configured to generate the second activation signal at least while the second driver bipolar transistor is activated, wherein the second blocking circuit is configured to activate in response to activation of the first driver bipolar transistor, and wherein the second blocking circuit when activated is configured to bias the base of the second driver bipolar transistor to a different voltage than the emitter of the second driver bipolar transistor to slow down discharge of accumulated base charge of the second driver bipolar transistor such that the second driver bipolar transistor remains activated for a longer period of time than had the base of the second driver bipolar transistor been biased to the same voltage as the emitter of the second bipolar transistor.

5. The apparatus of claim 1, wherein the first blocking circuit is configured to reduce standing leakage and avoid activation of the first driver bipolar transistor in the absence of the transient electrical stress event.

6. The apparatus of claim 1, wherein the first driver bipolar transistor has a PNP structure, and wherein the first blocking circuit biases the base of the first driver bipolar transistor by providing the base of the first driver bipolar transistor a reference voltage below the emitter voltage of the first driver bipolar transistor.

7. The apparatus of claim 6, wherein the second activation signal has a duration based at least partly on a duration of the first activation signal and on a duration of time that the first driver bipolar transistor retains its base charge.

8. The apparatus of claim 1, wherein the discharge circuit comprises a discharge PNP bipolar transistor having a base operatively coupled to the driver circuit, an emitter operatively coupled to the first node, and a collector operatively coupled to the second node.

9. The apparatus of claim 1, wherein the discharge circuit comprises a discharge NPN bipolar transistor having a base operatively coupled to the driver circuit, an emitter operatively coupled to the second node, and a collector operatively coupled to the first node.

10. The apparatus of claim 9, wherein the driver circuit further includes a first load having a first terminal and a second terminal, the first terminal of the first load being operatively coupled to the collector of the first driver bipolar transistor, the second terminal of the first load being operatively coupled to the second node, wherein the first driver bipolar transistor has a PNP structure, and wherein the base of the first driver bipolar transistor is operatively coupled to the first blocking circuit and to the detection circuit.

11. The apparatus of claim 10, wherein the first load includes one or more diode-connected transistors operatively coupled in series between the first and second terminals of the first load.

12. The apparatus of claim 11, wherein the first blocking circuit includes a first blocking resistor and a first blocking diode stack, the first blocking resistor and the first blocking diode stack being operatively coupled in series between the first node and the base of the first driver bipolar transistor.

13. The apparatus of claim 12, further comprising a second blocking circuit operatively coupled to the driver circuit, and wherein the driver circuit further includes a second driver bipolar transistor and a second load, the second driver bipolar transistor being operatively coupled to the second blocking circuit and between the first driver bipolar transistor and the discharge circuit, the second driver bipolar transistor having a PNP structure and having a base, an emitter, and a collector, wherein the base of the second driver bipolar transistor is operatively coupled to the emitter of the first driver transistor and the second blocking circuit, the emitter of the second driver bipolar transistor is operatively coupled to the first node, the collector of the second driver bipolar transistor is operatively coupled to a first terminal of the second load, the second load having a second terminal operatively coupled to the second node.

14. The apparatus of claim 13, wherein the second blocking circuit includes a second blocking resistor and a second blocking diode stack, the second blocking resistor and the second blocking diode stack being operatively coupled in series between the first node and the base of the second driver bipolar transistor.

15. The apparatus of claim 14, wherein the second load includes a resistor having a first terminal operatively coupled to the collector of the second driver bipolar transistor and a second terminal operatively coupled to the second node.

16. The apparatus of claim 13, further comprising:
a voltage reference circuit having a voltage reference output and a first sensing terminal and a second sensing terminal, the first sensing terminal operatively coupled to the first node, the second sensing terminal being operatively coupled to the second node; and
a field effect transistor having a base terminal, a first signal terminal, and a second signal terminal, the base terminal being operatively coupled to the voltage reference output of the voltage reference circuit, the first signal terminal being operatively coupled to the first node, the second signal terminal being operatively coupled to the base of the second driver bipolar transistor,
wherein the voltage reference circuit is configured generate a first signal at the voltage reference output to turn off the field effect transistor by the gate terminal in response to a transient electrical event, and configured to generate a second signal at the voltage reference output to turn on the field effect transistor by the gate terminal to bias the base of the second driver bipolar transistor at a voltage of the first node otherwise.

17. The apparatus of claim 12, wherein the driver circuit further includes and a second driver bipolar transistor, a second load, and a first compensation capacitor, wherein the second driver bipolar transistor has a base operatively coupled to the emitter of the first bipolar transistor and to the first node, a collector operatively coupled to a first terminal of the second load, and an emitter operatively coupled to the first node, wherein the second load has a second terminal operatively coupled to the second node, and wherein the first compensation capacitor is operatively coupled across the base and collector of the first driver bipolar transistor.

18. The apparatus of claim 17, wherein the detection circuit includes a detection capacitor having a first terminal and a second terminal, a detection resistor having a first terminal and a second terminal, a second compensation capacitor having a first terminal and a second terminal, and a detection NPN bipolar transistor having a base, an emitter, and a collector, wherein the first terminal of the detection capacitor is operatively coupled to the first node, the second terminal of the detection capacitor is operatively coupled to the base of the detection NPN bipolar transistor, the first terminal of the detection resistor is operatively coupled to the base of the detection NPN bipolar transistor, the second terminal of the detection resistor is operatively coupled to the second node, the first terminal of the second compensation capacitor is operatively coupled to the collector of the detection NPN bipolar transistor, the second terminal of the second compensation capacitor is operatively coupled to the base of the detection NPN bipolar transistor, the collector of the detection NPN bipolar transistor is operatively coupled to the base of the first driver bipolar transistor, and the emitter of the detection NPN bipolar transistor is operatively coupled to the second node.

19. The apparatus of claim 9, further comprising:
a capacitor of the detection circuit, the capacitor having a first terminal operatively coupled to the first node and a second terminal operatively coupled to a third node;
a resistor of the detection circuit, the resistor having a first terminal operatively coupled to the third node and a second terminal operatively coupled to the second node;
a detection bipolar transistor having a base, an emitter, and a collector, the base being operatively coupled to the third node, the emitter being operatively coupled to the second node, and the collector being operatively coupled to the driver circuit;
a voltage reference circuit having a voltage reference output, a first sensing terminal, and a second sensing terminal, the first sensing terminal being operatively coupled to the first node, the second sensing terminal being operatively coupled to the second node; and
a field effect transistor having a base terminal and a first signal terminal and a second signal terminal, the base terminal being operatively coupled to the voltage reference output of the voltage reference circuit, the first signal terminal being operatively coupled to the base of the detection bipolar transistor, the second signal terminal being operatively coupled to the base of the discharge bipolar transistor,
wherein the voltage reference circuit is configured generate a first signal at the voltage reference output to turn off the field effect transistor by the gate terminal in response to a transient electrical event, and configured to generate a second signal at the voltage reference output to turn on the field effect transistor by the gate terminal to bias the base of the discharge bipolar transistor at the voltage of the base of the detector bipolar transistor otherwise.

20. The apparatus of claim 9, further comprising:
a capacitor of the detection circuit, the capacitor having a first terminal operatively coupled to the first node and a second terminal operatively coupled to a third node;
a resistor of the detection circuit, the resistor having a first terminal operatively coupled to the third node and a second terminal operatively coupled to the second node;
a detection bipolar transistor having a base, an emitter, and a collector, the base being operatively coupled to the third node, the emitter operatively coupled to the second node, and the collector operatively coupled to the driver circuit;
a voltage reference circuit having a voltage reference output and a first sensing terminal and a second sensing terminal, the first sensing terminal operatively coupled to the first node, the second sensing terminal being operatively coupled to the second node; and
a field effect transistor having a base terminal and a first signal terminal and a second signal terminal, the base terminal being operatively coupled to the voltage reference output of the voltage reference circuit, the first signal terminal being operatively coupled to the second node, the second signal terminal being operatively coupled to the base of the discharge bipolar transistor,
wherein the voltage reference circuit is configured generate a voltage reference signal to turn off the field effect transistor by the gate terminal in response to a transient electrical event, and configured to generate a voltage reference signal to turn on the field effect transistor by the gate terminal to bias the base of the discharge bipolar transistor at the voltage of the second node otherwise.

21. An apparatus to provide transient electrical event protection, the apparatus comprising:
a detection circuit configured to generate a first activation signal in response to a transient electrical stress event across a first node and a second node;
a driver circuit operatively coupled to the detection circuit, the driver circuit including a first driver bipolar transistor having a base, an emitter, and a collector, wherein the first driver bipolar transistor is configured to activate, saturate, and accumulate base charge in response to the first activation signal, and wherein the driver circuit is configured to generate a second activation signal at least while the first driver bipolar transistor is activated;
a discharge circuit operatively coupled to the driver circuit and configured to activate a low impedance path between the first node and the second node at least while the driver circuit generates the second activation signal; and
a means for biasing the base of the first driver bipolar transistor to a different voltage than the emitter of the first driver bipolar transistor for a period of time after the first activation signal has ceased to slow down discharge of the base charge of the first driver bipolar transistor such that the first driver bipolar transistor remains activated for a longer period of time than had the base of the first driver bipolar transistor been biased to the same voltage as the emitter of the first bipolar transistor.

22. A method of providing transient electrical protection, the method comprising:
generating a first activation signal in response to a transient electrical stress event across a first node and a second node;
generating a second activation signal in response to the first activation signal by using a driver circuit, the driver circuit including a first driver bipolar transistor having a base, an emitter, and a collector, wherein the first driver bipolar transistor is configured to saturate and to accumulate base charge in response to the first activation signal, and wherein the driver circuit is configured to generate a second activation signal at least while the first driver bipolar transistor is saturated;
activating a low impedance path between the first node and the second node in response to the second activation signal; and
biasing the base of the first driver bipolar transistor to a different voltage than the emitter of the first driver bipolar transistor for a period of time after the first activation signal has ceased to slow down discharge of accumulated base charge of the first driver bipolar transistor such that the first driver bipolar transistor remains activated for a longer period of time than had the base of the first driver bipolar transistor been biased to the same voltage as the emitter of the first bipolar transistor.

23. The method of claim 22, further comprising biasing a base of a second driver bipolar transistor of the driver circuit to a different voltage than the emitter of the second driver bipolar transistor in response to the first activation signal, wherein the second driver bipolar transistor is operatively coupled to the first driver bipolar transistor, wherein the second driver bipolar transistor is configured to activate and to accumulate base charge in response to activation of the first driver bipolar transistor, wherein the driver circuit is configured to generate the second activation signal at least while second driver bipolar transistor is activated, and wherein the biasing of the base of the second driver bipolar transistor slows down discharge of accumulated base charge of the second driver bipolar transistor such that the second driver bipolar transistor remains activated for a longer period of time than had the base of the second driver bipolar transistor been biased to the same voltage as the emitter of the second bipolar transistor.

* * * * *